United States Patent
Yamamoto et al.

(10) Patent No.: US 6,844,092 B2
(45) Date of Patent: Jan. 18, 2005

(54) OPTICALLY FUNCTIONAL ELEMENT AND PRODUCTION METHOD AND APPLICATION THEREFOR

(75) Inventors: Hiroki Yamamoto, Hitachi (JP); Takashi Naito, Mito (JP); Ken Takahashi, Tokai (JP); Motoyasu Terao, Hinode (JP); Toshimichi Shintani, Kodaira (JP); Fumiyoshi Kirino, Tokyo (JP); Eiji Koyama, Tsuchiura (JP); Sumio Hosaka, Hinode (JP); Sachiko Okuzaki, Hitachi (JP); Takashi Namekawa, Hitachi (JP); Tetsuo Nakazawa, Tomobe (JP)

(73) Assignee: Hitachi, Ltd., Tokyo (JP)

( * ) Notice: Subject to any disclaimer, the term of this patent is extended or adjusted under 35 U.S.C. 154(b) by 43 days.

(21) Appl. No.: 10/368,345

(22) Filed: Feb. 20, 2003

(65) Prior Publication Data

US 2003/0161986 A1 Aug. 28, 2003

Related U.S. Application Data

(63) Continuation of application No. 10/110,376, filed as application No. PCT/JP99/05709 on Oct. 15, 1999.

(51) Int. Cl.$^7$ ................................................. B32B 3/02
(52) U.S. Cl. .................. 428/702; 430/270.1; 430/495.1
(58) Field of Search ............................... 428/64.1, 64.4, 428/702, 913; 430/270.1, 495.1, 945

(56) References Cited

U.S. PATENT DOCUMENTS

| | | | | |
|---|---|---|---|---|
| 5,305,143 A | * | 4/1994 | Taga et al. .................. 359/488 |
| 6,524,766 B1 | * | 2/2003 | Ariyoshi et al. ........ 430/270.13 |
| 2003/0147584 A1 | * | 8/2003 | Honda et al. ................. 385/22 |
| 2003/0152739 A1 | * | 8/2003 | Yamamoto et al. ......... 428/64.4 |
| 2003/0198832 A1 | * | 10/2003 | Nakamura et al. ..... 428/694 BS |

FOREIGN PATENT DOCUMENTS

| | | |
|---|---|---|
| JP | 3-296202 | 12/1991 |
| JP | 4-97104 | 3/1992 |
| JP | 5-158079 | 6/1993 |
| JP | 5-224262 | 9/1993 |
| JP | 5-334924 | 12/1993 |
| JP | 7-20600 | 1/1995 |
| JP | 7-248415 | 9/1995 |
| JP | 7-248516 | 9/1995 |
| JP | 10-340482 | 12/1998 |

OTHER PUBLICATIONS

H. Kashani, "*Journal of Electronic Materials*" vol. 27, No. 7, 1998, pp. 876–882.

(List continued on next page.)

*Primary Examiner*—Elizabeth Mulvaney
(74) *Attorney, Agent, or Firm*—McDermott Will & Emery LLP

(57) ABSTRACT

The object of the present invention is to provide an optically functional element having a large change in refractive index with temperature change and a fast change rate in refractive index, a production method for the same and optical switch, temperature sensor and optical information recording medium using the same. The present invention provides a thin film formed directly on a substrate or via other layers, and the film is composed of particles with an average diameter of not larger than 13 nm, observed at film surface. The present invention also provides an optically functional element having an amount of change in refractive index of not less than $2.0 \times 10^{-4}/°$ C. The present invention further provides a production method for said thin film by sputtering under reduced pressure in an inert gas atmosphere containing 3–15% by volume of oxygen, and optical switch, temperature sensor and optical information recording medium using said element.

3 Claims, 18 Drawing Sheets

LIGHT SOURCE

OTHER PUBLICATIONS

*Handbook of Optical Materials*, Jan. 31, 1992, pp. 166–169, 259–269, 357–367.

T. Itoh, S. Hori, M. Abe, and Y. Tamaura, "Light–Enhanced Ferrite Plating of $Fe_{3-x}M_xO_4$ (M=Ni, Zn, Co, and Mn) Films in an Aqueous Solution (invited)," *Journal of Applied Physics*, vol. 69, No. 8, Apr. 15, 1991, pp. 5911–5914.

K. Ellmer and R. Mientus, "Structural, Electrical and Optical Properties of Reactive Magnetron Sputtered Poycrystalline ZnO:Al Films as a Function of the Oxygen Partial Pressure During Deposition," *Solid State Phenomena*, vol. 37–38, 1994, pp. 433–438.

Y. Bao–Long, Z. Cong–Shan, and G. Fu–Xi, "Measurement on the Thermo–Optic Coefficient dn/dT of Semiconductor PbS Nanoparticles and the Study on Their Optical Limiting Effects," *Physics Report*, vol. 46, No. 12. Dec. 1997, pp. 2394–2399.

F. Flory, H. Rigneault, N. Maythaveekulchai and F. Zamkotsian, "Characterization by Guided Wave of Instabilities of Optical Coatings Submitted to High–Power Flux: Thermal and Third–Order Nonlinear Properties of Dielectric Thin Films," *Applied Optics*, vol. 32, No. 28, Oct. 1, 1993, pp. 5628–5639.

K. Saenger and J. Gupta, "Laser Interferometric Thermometry for Substrate Temperature Measurement," *Applied Optics*, vol. 30, No. 10, Apr. 1, 1991, pp. 1221–1226.

B. Danenberg, S. Baliga, R. Gambino, A. King, and A. Doctor, "Infrared Optical Properties of $Mn_{1.56}Co_{0.96}Ni_{0.48}O_4$ Spinel Films Sputter Deposited in an Oxygen Partial Pressure Series," *Journal of Applied Physics*, vol. 86, No. 5, Sep. 1, 1999, pp. 2590–2601.

* cited by examiner

LIGHT SOURCE

LIGHT SOURCE

OPTICALLY FUNCTIONAL ELEMENT AND PRODUCTION METHOD AND APPLICATION THEREFOR

This application is a continuation of application Ser. No. 10/110,376 filed Aug. 22, 2002, which is a 371 application of PCT/J99/05709, filed Oct. 15, 1999.

TECHNICAL FIELD

The present invention relates to a novel optically functional element, its production method and various applications using the same. In particular, the present invention relates to an optically functional element applicable to an optical switch with a large change in refractive index with temperature, temperature sensor and optical information recording medium, along with a production method for the same.

BACKGROUND ART

Optically functional materials, of which optical characteristics such as transmittance and refractive index change by exterior field such as light, temperature and electric field, have been used as elements such as optical switch, optical modulator, light amplifier, wavelength selective element, optical soliton element, optical information recording medium, temperature sensor and electro-optical element.

Examples of materials with a transmittance changeable by exterior field include such as photochromism, thermochromism and electrochromism materials. In these materials, transmittance can be changed reversibly by an application of light, temperature and electrical field, respectively, correspondingly to their intensity, and thus they are used as optical switch, temperature sensor, masking layer for optical information recording medium and the like by shielding transmitted light or controlling spot diameter of transmitted light. As examples of these materials, the following are known: Organic photochromism materials such as derivatives of triphenylmethan, azobenzene and spiropyran disclosed in JP-A-7-20600, organic or inorganic thermochromism materials such as N-salicylideneaniline, $AgHgI_4$ and $Cu_2HgI_4$, along with materials in which these materials are dispersed in dielectric materials having different refractive indices.

On the other hand, as examples of materials with refractive index changeable by exterior field, second or third order non-linear optical materials are known, of which refractive indices change at a part applied with laser or electric field. As second order non-linear optical materials, the following are known: Organic materials such as nitropyridine derivatives and methylnitroaniline (MNA) and inorganic dielectric materials such as $KNbO_3$ and $LiNbO_3$, which have been used as optical switch, electro-optical element and the like. Third order non-linear optical materials include glass dispersed with semiconductor fine particles such as CuCl and CdS, which have been used as optical switch of light waveguide type wavelength selection element and light pulse generating element (See "Handbook of Optical Materials": published by Realize Co., Ltd., 1992).

In addition, as materials with refractive index changeable with temperature, zinc based semiconductor materials such as ZnS and ZnSe and finely powdered PbS are known. Providing that amount of change in refractive index with temperature, $\Delta n_T$, is expressed by the following formula:

$$\Delta n_T = \left|\frac{\Delta n}{\Delta T}\right|$$

wherein, $\Delta n$ is amount of change in refractive index; and $\Delta T$ is amount of change in temperature these materials have been reported to have $\Delta n_T$ from about $5.95 \times 10^{-5}/°C.$ to about $1.47 \times 10^{-4}/°C.$ (See Physics Report, Vol. 46, No. 12, December 1997).

Further, as non-linear optical materials, the following are known: Those using $CO_3O_4$ and CoO as targets disclosed in JP-A-10-340482, amorphous metal oxides containing fine particles of Fe, Ni and Co disclosed in JP-A-5-224262 and substrates on which thin films of oxides of one or more elements of V, Cr, Mn, Fe, Ni, Co and Cu are formed as disclosed in JP-A-7-248516.

Since temperature sensor or device performing optical switching with temperature mainly works based on thermochromism switching as described above, amount of transmitted light varies. Therefore, they have not been suitable for a communication device in which such change gives unfavorable effects. Presently known devices made of materials whose refractive index changes with temperature have small change in refractive index and have been difficult to get sufficient change as switching or temperature sensor. Furthermore, these materials have response rate of refractive index with temperature in ms level, which is still slow in communication or light recording fields and thus have not been suitable to these applications.

Examples in the references of the above described "Physics Report" also required to be used as a dispersion in solvent due to powder form, which has made it difficult to be used as a thin film.

Furthermore, in optical switching also, these elements have had difficulty in characteristics control so as to have energy sufficient to raise change in refractive index or transmittance in these elements and to give incident laser light for stable output. The above patents do not disclose change in refractive index responsive to temperature, crystal particle size and crystal structure of oxide thin films.

Objectives of the present invention are to provide an optically functional element having large change in refractive index responsive to temperature change, its production methods and various applications using the same.

DISCLOSURE OF THE INVENTION

In an optically functional element with optically functional thin film on a substrate, the present invention is characterized in comprising at least one of the following: Said thin film consists of oxides and is composed of columnar crystal having average diameter of not larger than 13 nm, preferably not larger than 7 nm, said thin film consists of oxides and a change in average refractive index of 633 nm laser light from room temperature to 300° C. is not less than $2 \times 10^{-4}/°$ C., said thin film consists of oxides and is composed of columnar crystal inclined against said substrate surface, said thin film mainly consists of oxides of one or more types of Co and Fe having spinel structure and is composed of columnar crystal, and at least one type of Co and Fe of said thin film mainly consists of $M_3O_4$ oxides including not less than one oxide of Si, Ti, Al, Te, alkaline metals and alkaline earth metals and is composed of columnar crystal.

The present invention is further characterized in a production method for an optically functional element to form optically functional thin film consisting of oxides on a substrate, wherein said thin film is formed by sputtering under reduced pressure of inert gas atmosphere having 3–15% by volume of oxygen.

The present invention is characterized in an optical switch equipped with a light receiver to receive light introduced from light source and an optically functional element having optically functional thin film to alter light pass of said light, wherein said optically functional element is consisted of the above described optically functional element.

The present invention is characterized in a temperature sensor equipped with a light receiver to receive light introduced from light source and an optically functional element having optically functional thin film to alter light pass of said light, characterized in that said optically functional element is consisted of the above described optically functional element.

The present invention is characterized in a substrate with information formed by pits and recording medium of optical information to provide output of said information by reflection light from light reflection film formed on said substrate, wherein said reflection film has, at its incident side of light, an optically functional thin film having refractive index changeable depending on incident light intensity and said thin film is consisted of the above described thin film.

An optically functional thin film formed in an optically functional element of the present invention, is formed on a substrate directly or via other layers, which is composed of fine particles with average particle diameter of not larger than 13 nm observed at film surface and its refractive index changes in response to own temperature change. The above described change in refractive index, $\Delta n_T$, expressed by the following formula:

$$\Delta n_T = \left| \frac{\Delta n}{\Delta T} \right|$$

wherein,

Δn is amount of change in refractive index; and

ΔT is amount of change in temperature; is preferably not smaller than $2.0 \times 10^{-4}/°$ C. and that change is preferably completed in not slower than $1 \times 10^{-7}/°$ C. after completion of temperature change.

The above described particles have standard deviation of particle size of not larger than 30% of said average particle diameter and are columnar particles grown in an angle from 45 degree to 90 degree against interface between said thin film and substrate and grain boundary phase are formed at interfaces among particles. More preferably, the above described average particle diameter is not larger than 6 nm.

Said thin film is oxide-based one containing at least Co or Fe, more preferably crystalline fine particles containing Co or Fe and having spinel structure, and said grain boundary phase contains at least one types of element selected from a group consisting of at least Si, Ti, Al, Te, alkaline metals and alkaline earth metals. Furthermore, said tin film contains Co or Fe element in amount of 60–95% by weight as of oxide form, $M_3O_4$ (M=CO or Fe)

The above optically functional thin film is produced by forming said thin film on a substrate by sputtering target material surface with plasma generated on the target material, wherein, oxygen of not higher than 3–10% by volume is contained in said plasma formed in inert gas under reduced pressure.

Optical switch element of the present invention has an optical switch which is placed at optical pass and alters optical pass by change in temperature and temperature control mechanism, placed around the optical switch, to regulate element temperature. This optical switch changes temperature of itself in response to temperature control mechanism, which induces reversible change in refractive index in such a manner of amount of refractive index change, $\Delta n_T$, and response time as described above.

The above optical switch is a thin film formed directly on a substrate or via other layers, which contains Co or Fe, is composed of an assembly of fine crystalline particles with a diameter of not less than 2 nm and not larger than 20 nm, where grain boundary phase is as described above.

Temperature sensor of the present invention is one to measure ambient temperature and composed of at least light source, light introduced from the light source, light receiver of the light and sensor section placed at light pass to alter light pass with change in ambient temperature. The sensor section reversibly changes refractive index by change in own temperature and has an amount of refractive index change, $\Delta n_T$, and response time needed to change from an original refractive index, $n_0$, to a different refractive index after temperature change, as described above.

Thin film is formed at said sensor section is as described above. Said fine particles have diameter of preferably 2–200 nm and contains Co or Fe.

Thin film in accordance with the present invention preferably has a thickness of 25–100 nm and formed with a little inclination against substrate surface and formed by precipitation unidirectionally in columnar shape.

BEST MODE FOR CARRYING OUT THE INVENTION

Example 1

Figure 1:
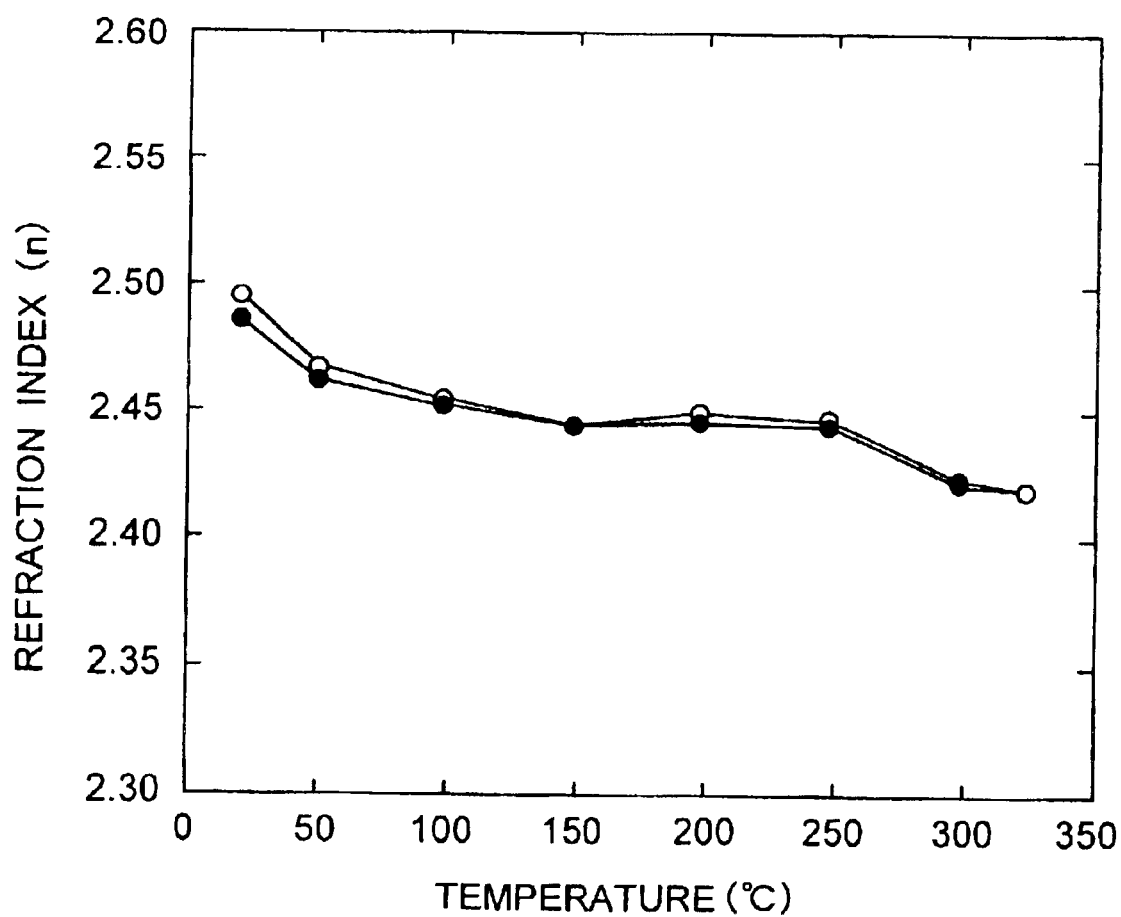
FIG. 1 shows amount of refractive index change, in response to temperature, of film (No.3) of the present invention, whose refractive index changes with temperature.

Table 1 shows compositions, sputtering conditions, deposited phases just after film formation, particle diameters, refractive indices at room temperature, extinction coefficients and changes in refractive index with temperature of thin films with a thickness of about 50 nm produced in accordance with the present invention. Particle diameters are averaged values for those deposited on substrate surface.

TABLE 1

| No. | Target 1 | Target 2 | Sputter Power (W) Target 1 | Sputter Power (W) Target 2 | Ultimate Degree of Vacuum (Torr) | Degree of Vacuum in Sputtering (Torr) | Kind of Gas | Deposited Phase | Particle Diameter (nm) | Refraction Index ($n_0$) (633 nm) | Extinction Coefficient ($k_0$) (633 nm) | $\Delta n_T$ | Change in $n_0$ with Temperature |
|---|---|---|---|---|---|---|---|---|---|---|---|---|---|
| 1 | $Co_3O_4$ | $50SiO_2$—$50TiO_2$ | 200 | 100 | $1 \times 10^{-6}$ | $3.5 \times 10^{-3}$ | Ar | $Co_3O_4$ | 8.2 | 2.520 | 0.45 | 4.00E-04 | ○ |
| 2 | $Co_3O_4$ | $50SiO_2$—$50TiO_2$ | 200 | 100 | $4 \times 10^{-7}$ | $3.5 \times 10^{-3}$ | Ar | $Co_3O_4$ | 8.4 | 2.521 | 0.58 | 3.33E-04 | ○ |
| 3 | $Co_3O_4$ | $50SiO_2$—$50TiO_2$ | 200 | 100 | $1 \times 10^{-6}$ | $5 \times 10^{-3}$ | Ar | $Co_3O_4$ | 10.2 | 2.489 | 0.54 | 2.67E-04 | ○ |
| 4 | $Co_3O_4$ | $50SiO_2$—$50TiO_2$ | 200 | 100 | $4 \times 10^{-7}$ | $5 \times 10^{-3}$ | Ar | $Co_3O_4$ | 10.3 | 2.560 | 0.56 | 2.33E-04 | ○ |
| 5 | $Co_3O_4$ | $50SiO_2$—$50TiO_2$ | 200 | 100 | $1 \times 10^{-6}$ | $7 \times 10^{-3}$ | Ar | $Co_3O_4$ | 12.8 | 2.623 | 0.56 | 2.00E-04 | ○ |
| 6 | $Co_3O_4$ | $50SiO_2$—$50TiO_2$ | 200 | 100 | $4 \times 10^{-7}$ | $7 \times 10^{-3}$ | Ar | $Co_3O_4$ | 13.2 | 2.601 | 0.55 | 6.67E-05 | △ |
| 7 | $Co_3O_4$ | $50SiO_2$—$50TiO_2$ | 200 | 100 | $1 \times 10^{-6}$ | $5 \times 10^{-3}$ | Ar + 1% $O_2$ | $Co_3O_4$ | 10.5 | 2.598 | 0.49 | 2.67E-04 | ○ |
| 8 | $Co_3O_4$ | $50SiO_2$—$50TiO_2$ | 200 | 100 | $4 \times 10^{-7}$ | $5 \times 10^{-3}$ | Ar + 1% $O_2$ | $Co_3O_4$ | 10.1 | 2.544 | 0.52 | 3.33E-04 | ○ |
| 9 | $Co_3O_4$ | $50SiO_2$—$50TiO_2$ | 200 | 100 | $1 \times 10^{-6}$ | $5 \times 10^{-3}$ | Ar + 5% $O_2$ | $Co_3O_4$ | 5.9 | 2.582 | 0.48 | 5.00E-04 | ◎ |
| 10 | $Co_3O_4$ | $50SiO_2$—$50TiO_2$ | 200 | 100 | $4 \times 10^{-7}$ | $5 \times 10^{-3}$ | Ar + 5% $O_2$ | $Co_3O_4$ | 5.7 | 2.486 | 0.50 | 5.00E-04 | ◎ |
| 11 | $Co_3O_4$ | $50SiO_2$—$50TiO_2$ | 200 | 100 | $1 \times 10^{-6}$ | $5 \times 10^{-3}$ | Ar + 10% $O_2$ | $Co_3O_4$ | 5.9 | 2.537 | 0.43 | 5.00E-04 | ◎ |
| 12 | $Co_3O_4$ | $50SiO_2$—$50TiO_2$ | 200 | 100 | $4 \times 10^{-7}$ | $5 \times 10^{-3}$ | Ar + 10% $O_2$ | $Co_3O_4$ | 5.8 | 2.491 | 0.51 | 4.67E-04 | ◎ |
| 13 | CoO | $50SiO_2$—$50TiO_2$ | 200 | 100 | $1 \times 10^{-6}$ | $3.5 \times 10^{-3}$ | Ar | $Co_3O_4$ | 8.6 | 2.499 | 0.56 | 2.67E-04 | ○ |
| 14 | CoO | $50SiO_2$—$50TiO_2$ | 200 | 100 | $4 \times 10^{-7}$ | $3.5 \times 10^{-3}$ | Ar | CoO | 8.5 | 2.520 | 0.05 | 3.33E-05 | × |
| 15 | CoO | $50SiO_2$—$50TiO_2$ | 200 | 100 | $1 \times 10^{-6}$ | $5 \times 10^{-3}$ | Ar | $Co_3O_4$ | 10.0 | 2.495 | 0.50 | 2.67E-04 | ○ |
| 16 | CoO | $50SiO_2$—$50TiO_2$ | 200 | 100 | $4 \times 10^{-7}$ | $5 \times 10^{-3}$ | Ar | CoO | 10.3 | 2.654 | 0.02 | 1.67E-05 | × |
| 17 | CoO | $50SiO_2$—$50TiO_2$ | 200 | 100 | $1 \times 10^{-6}$ | $7 \times 10^{-3}$ | Ar | $Co_3O_4$ | 12.2 | 2.598 | 0.51 | 1.33E-05 | × |
| 18 | CoO | $50SiO_2$—$50TiO_2$ | 200 | 100 | $4 \times 10^{-7}$ | $7 \times 10^{-3}$ | Ar | CoO | 12.3 | 2.652 | 0.05 | 2.33E-05 | × |
| 19 | CoO | $50SiO_2$—$50TiO_2$ | 200 | 100 | $1 \times 10^{-6}$ | $5 \times 10^{-3}$ | Ar + 1% $O_2$ | $Co_3O_4$ | 10.4 | 2.461 | 0.52 | 3.33E-04 | ○ |
| 20 | CoO | $50SiO_2$—$50TiO_2$ | 200 | 100 | $4 \times 10^{-7}$ | $5 \times 10^{-3}$ | Ar + 1% $O_2$ | CoO | 10.6 | 2.623 | 0.02 | 1.33E-05 | × |
| 21 | CoO | $50SiO_2$—$50TiO_2$ | 200 | 100 | $1 \times 10^{-6}$ | $5 \times 10^{-3}$ | Ar + 5% $O_2$ | $Co_3O_4$ | 5.9 | 2.556 | 0.66 | 5.00E-04 | ◎ |
| 22 | CoO | $50SiO_2$—$50TiO_2$ | 200 | 100 | $4 \times 10^{-7}$ | $5 \times 10^{-3}$ | Ar + 5% $O_2$ | $Co_3O_4$ | 6.2 | 2.541 | 0.54 | 5.67E-04 | ◎ |
| 23 | CoO | $50SiO_2$—$50TiO_2$ | 200 | 100 | $1 \times 10^{-6}$ | $5 \times 10^{-3}$ | Ar + 10% $O_2$ | $Co_3O_4$ | 5.4 | 2.603 | 0.41 | 4.67E-04 | ◎ |
| 24 | CoO | $50SiO_2$—$50TiO_2$ | 200 | 100 | $4 \times 10^{-7}$ | $5 \times 10^{-3}$ | Ar + 10% $O_2$ | $Co_3O_4$ | 5.6 | 2.605 | 0.45 | 4.00E-04 | ◎ |
| 25 | $Co_3O_4$ | $SiO_2$—$Na_2O$—CaO | 200 | 100 | $1 \times 10^{-6}$ | $3.5 \times 10^{-3}$ | Ar | $Co_3O_4$ | 8.0 | 2.452 | 0.46 | 3.33E-04 | ○ |
| 26 | $Co_3O_4$ | $SiO_2$—$Na_2O$—CaO | 200 | 100 | $4 \times 10^{-7}$ | $3.5 \times 10^{-3}$ | Ar | $Co_3O_4$ | 8.6 | 2.516 | 0.59 | 4.00E-04 | ○ |
| 27 | $Co_3O_4$ | $SiO_2$—$Na_2O$—CaO | 200 | 100 | $1 \times 10^{-6}$ | $5 \times 10^{-3}$ | Ar | $Co_3O_4$ | 10.4 | 2.566 | 0.53 | 2.67E-04 | ○ |
| 28 | $Co_3O_4$ | $SiO_2$—$Na_2O$—CaO | 200 | 100 | $4 \times 10^{-7}$ | $5 \times 10^{-3}$ | Ar | $Co_3O_4$ | 10.5 | 2.562 | 0.55 | 2.33E-04 | ○ |
| 29 | $Co_3O_4$ | $SiO_2$—$Na_2O$—CaO | 200 | 100 | $1 \times 10^{-6}$ | $7 \times 10^{-3}$ | Ar | $Co_3O_4$ | 12.9 | 2.608 | 0.54 | 2.00E-04 | ○ |
| 30 | $Co_3O_4$ | $SiO_2$—$Na_2O$—CaO | 200 | 100 | $4 \times 10^{-7}$ | $7 \times 10^{-3}$ | Ar | $Co_3O_4$ | 13.5 | 2.578 | 0.54 | 3.33E-05 | △ |
| 31 | $Co_3O_4$ | $SiO_2$—$Na_2O$—CaO | 200 | 100 | $1 \times 10^{-6}$ | $5 \times 10^{-3}$ | Ar + 1% $O_2$ | $Co_3O_4$ | 10.0 | 2.598 | 0.50 | 2.67E-04 | ○ |
| 32 | $Co_3O_4$ | $SiO_2$—$Na_2O$—CaO | 200 | 100 | $4 \times 10^{-7}$ | $5 \times 10^{-3}$ | Ar + 1% $O_2$ | $Co_3O_4$ | 10.9 | 2.556 | 0.53 | 3.33E-04 | ○ |
| 33 | $Co_3O_4$ | $SiO_2$—$Na_2O$—CaO | 200 | 100 | $1 \times 10^{-6}$ | $5 \times 10^{-3}$ | Ar + 5% $O_2$ | $Co_3O_4$ | 6.2 | 2.590 | 0.50 | 5.00E-04 | ◎ |
| 34 | $Co_3O_4$ | $SiO_2$—$Na_2O$—CaO | 200 | 100 | $4 \times 10^{-7}$ | $5 \times 10^{-3}$ | Ar + 5% $O_2$ | $Co_3O_4$ | 5.2 | 2.470 | 0.51 | 5.00E-04 | ◎ |
| 35 | $Co_3O_4$ | $SiO_2$—$Na_2O$—CaO | 200 | 100 | $1 \times 10^{-6}$ | $5 \times 10^{-3}$ | Ar + 10% $O_2$ | $Co_3O_4$ | 5.4 | 2.562 | 0.48 | 5.00E-04 | ◎ |
| 36 | $Co_3O_4$ | $SiO_2$—$Na_2O$—CaO | 200 | 100 | $4 \times 10^{-7}$ | $5 \times 10^{-3}$ | Ar + 10% $O_2$ | $Co_3O_4$ | 5.6 | 2.568 | 0.49 | 4.67E-04 | ◎ |
| 37 | CoO | $SiO_2$—$Na_2O$—CaO | 200 | 100 | $1 \times 10^{-6}$ | $3.5 \times 10^{-3}$ | Ar | $Co_3O_4$ | 8.2 | 2.501 | 0.57 | 2.67E-04 | ○ |
| 38 | CoO | $SiO_2$—$Na_2O$—CaO | 200 | 100 | $4 \times 10^{-7}$ | $3.5 \times 10^{-3}$ | Ar | CoO | 8.3 | 2.520 | 0.08 | 3.33E-05 | × |
| 39 | CoO | $SiO_2$—$Na_2O$—CaO | 200 | 100 | $1 \times 10^{-6}$ | $5 \times 10^{-3}$ | Ar | $Co_3O_4$ | 10.2 | 2.500 | 0.51 | 2.50E-04 | ○ |
| 40 | CoO | $SiO_2$—$Na_2O$—CaO | 200 | 100 | $4 \times 10^{-7}$ | $5 \times 10^{-3}$ | Ar | CoO | 10.5 | 2.659 | 0.08 | 1.67E-05 | × |
| 41 | CoO | $SiO_2$—$Na_2O$—CaO | 200 | 100 | $1 \times 10^{-6}$ | $7 \times 10^{-3}$ | Ar | $Co_3O_4$ | 11.9 | 2.577 | 0.10 | 1.33E-05 | × |
| 42 | CoO | $SiO_2$—$Na_2O$—CaO | 200 | 100 | $4 \times 10^{-7}$ | $7 \times 10^{-3}$ | Ar | CoO | 12.0 | 2.456 | 0.04 | 2.33E-05 | × |
| 43 | CoO | $SiO_2$—$Na_2O$—CaO | 200 | 100 | $1 \times 10^{-6}$ | $5 \times 10^{-3}$ | Ar + 1% $O_2$ | $Co_3O_4$ | 10.6 | 2.469 | 0.51 | 3.33E-04 | ○ |
| 44 | CoO | $SiO_2$—$Na_2O$—CaO | 200 | 100 | $4 \times 10^{-7}$ | $5 \times 10^{-3}$ | Ar + 1% $O_2$ | CoO | 10.4 | 2.625 | 0.08 | 1.33E-05 | × |
| 45 | CoC | $SiO_2$—$Na_2O$—CaO | 200 | 100 | $1 \times 10^{-6}$ | $5 \times 10^{-3}$ | Ar + 5% $O_2$ | $Co_3O_4$ | 5.5 | 2.445 | 0.61 | 5.00E-04 | ◎ |

TABLE 1-continued

| No. | Target 1 | Target 2 | Sputter Power (W) Target 1 | Sputter Power (W) Target 2 | Ultimate Degree of Vacuum (Torr) | Degree of Vacuum in Sputtering (Torr) | Kind of Gas | Deposited Phase | Particle Diameter (nm) | Refraction Index ($n_0$) (633 nm) | Extinction Coefficient ($k_0$) (633 nm) | $\Delta n_T$ | Change in $n_0$ with Temperature |
|---|---|---|---|---|---|---|---|---|---|---|---|---|---|
| 46 | CoC | SiO$_2$—Na$_2$O—CaO | 200 | 100 | 4 × 10$^{-7}$ | 5 × 10$^{-3}$ | Ar + 5% O$_2$ | Co$_3$O$_4$ | 5.6 | 2.545 | 0.52 | 5.67E-04 | ◎ |
| 47 | CoC | SiO$_2$—Na$_2$O—CaO | 200 | 100 | 1 × 10$^{-6}$ | 5 × 10$^{-3}$ | Ar + 10% O$_2$ | Co$_3$O$_4$ | 5.9 | 2.589 | 0.48 | 4.67E-04 | ◎ |
| 48 | CoC | SiO$_2$—Na$_2$O—CaO | 200 | 100 | 4 × 10$^{-7}$ | 5 × 10$^{-3}$ | Ar + 10% O$_2$ | Co$_3$O$_4$ | 6.0 | 2.600 | 0.49 | 4.00E-04 | ◎ |
| 49 | Co$_3$O$_4$ | TeO$_2$ | 200 | 100 | 1 × 10$^{-6}$ | 3.5 × 10$^{-3}$ | Ar | — | — | — | — | — | — |
| 50 | Co$_3$O$_4$ | TeO$_2$ | 200 | 100 | 4 × 10$^{-7}$ | 3.5 × 10$^{-3}$ | Ar | — | — | — | — | — | — |
| 51 | Co$_3$O$_4$ | TeO$_2$ | 200 | 100 | 1 × 10$^{-6}$ | 5 × 10$^{-3}$ | Ar | — | — | — | — | — | — |
| 52 | Co$_3$O$_4$ | TeO$_2$ | 200 | 100 | 4 × 10$^{-7}$ | 5 × 10$^{-3}$ | Ar | — | — | — | — | — | — |
| 53 | Co$_3$O$_4$ | TeO$_2$ | 200 | 100 | 1 × 10$^{-6}$ | 7 × 10$^{-3}$ | Ar | — | — | — | — | — | — |
| 54 | Co$_3$O$_4$ | TeO$_2$ | 200 | 100 | 4 × 10$^{-7}$ | 5 × 10$^{-3}$ | Ar | — | — | — | — | — | — |
| 55 | Co$_3$O$_4$ | TeO$_2$ | 200 | 100 | 1 × 10$^{-6}$ | 5 × 10$^{-3}$ | Ar + 1% O$_2$ | — | — | — | — | — | — |
| 56 | Co$_3$O$_4$ | TeO$_2$ | 200 | 100 | 4 × 10$^{-7}$ | 5 × 10$^{-3}$ | Ar + 1% O$_2$ | Amorphous | — | 2.754 | 0.06 | 3.33E-04 | ○ |
| 57 | Co$_3$O$_4$ | TeO$_2$ | 200 | 100 | 1 × 10$^{-6}$ | 5 × 10$^{-3}$ | Ar + 5% O$_2$ | Amorphous | — | 2.785 | 0.12 | 2.83E-04 | ○ |
| 58 | Co$_3$O$_4$ | TeO$_2$ | 200 | 100 | 4 × 10$^{-7}$ | 5 × 10$^{-3}$ | Ar + 5% O$_2$ | Amorphous | — | 2.802 | 0.14 | 2.83E-04 | ○ |
| 59 | Co$_3$O$_4$ | TeO$_2$ | 200 | 100 | 1 × 10$^{-6}$ | 5 × 10$^{-3}$ | Ar + 10% O$_2$ | Amorphous | — | 2.785 | 0.10 | 3.00E-04 | ○ |
| 60 | Co$_3$O$_4$ | TeO$_2$ | 200 | 100 | 4 × 10$^{-7}$ | 5 × 10$^{-3}$ | Ar + 10% O$_2$ | Amorphous | — | — | — | — | — |
| 61 | Co$_3$O$_4$ | Al$_2$O$_3$ | 200 | 100 | 1 × 10$^{-6}$ | 5 × 10$^{-3}$ | Ar | CoO | 10.2 | 2.500 | 0.08 | 2.33E-05 | × |
| 62 | Co$_3$O$_4$ | Al$_2$O$_3$ | 200 | 100 | 4 × 10$^{-7}$ | 5 × 10$^{-3}$ | Ar | CoO | 10.5 | 2.659 | 0.05 | 2.00E-05 | × |
| 63 | Co$_3$O$_4$ | Al$_2$O$_3$ | 200 | 100 | 1 × 10$^{-6}$ | 5 × 10$^{-3}$ | Ar + 1% O$_2$ | CoO | 10.6 | 2.469 | 0.06 | 3.33E-05 | × |
| 64 | Co$_3$O$_4$ | Al$_2$O$_3$ | 200 | 100 | 4 × 10$^{-7}$ | 5 × 10$^{-3}$ | Ar + 5% O$_2$ | CoO | 10.4 | 2.625 | 0.54 | 4.00E-04 | × |
| 65 | Co$_3$O$_4$ | Al$_2$O$_3$ | 200 | 100 | 1 × 10$^{-6}$ | 5 × 10$^{-3}$ | Ar + 10% O$_2$ | Co$_3$O$_4$ | 5.6 | 2.545 | 0.58 | 4.67E-04 | ○ |
| 66 | Co$_3$O$_4$ | SiO$_2$ | 200 | 100 | 4 × 10$^{-7}$ | 5 × 10$^{-3}$ | Ar | Co$_3$O$_4$ | 6.0 | 2.600 | 0.02 | 1.00E-05 | × |
| 67 | Co$_3$O$_4$ | SiO$_2$ | 200 | 100 | 1 × 10$^{-6}$ | 5 × 10$^{-3}$ | Ar | CoO | 10.9 | 2.500 | 0.03 | 1.33E-05 | × |
| 68 | Co$_3$O$_4$ | SiO$_2$ | 200 | 100 | 4 × 10$^{-7}$ | 5 × 10$^{-3}$ | Ar | CoO | 9.5 | 2.659 | 0.04 | 1.33E-05 | × |
| 69 | Co$_3$O$_4$ | SiO$_2$ | 200 | 100 | 1 × 10$^{-6}$ | 5 × 10$^{-3}$ | Ar + 1% O$_2$ | CoO | 10.2 | 2.469 | 0.02 | 1.00E-05 | × |
| 70 | Co$_3$O$_4$ | SiO$_2$ | 200 | 100 | 4 × 10$^{-7}$ | 5 × 10$^{-3}$ | Ar + 5% O$_2$ | CoO | 10.0 | 2.625 | 0.08 | 1.33E-05 | × |
| 71 | Co$_3$O$_4$ | SiO$_2$ | 200 | 100 | 1 × 10$^{-6}$ | 5 × 10$^{-3}$ | Ar + 10% O$_2$ | CoO | 6.3 | 2.545 | 0.02 | 1.33E-05 | × |
| 72 | Co$_3$O$_4$ | SiO$_2$ | 200 | 100 | 4 × 10$^{-7}$ | 5 × 10$^{-3}$ | Ar + 10% O$_2$ | CoO | 6.2 | 2.600 | 0.05 | 1.67E-05 | × |
| 73 | Cr$_2$O$_3$ | SiO$_2$—Na$_2$O—CaO | 200 | 100 | 1 × 10$^{-6}$ | 3.5 × 10$^{-3}$ | Ar | Cr$_2$O$_3$ | 8.2 | 2.452 | 0.09 | 1.33E-05 | × |
| 74 | Cr$_2$O$_3$ | SiO$_2$—Na$_2$O—CaO | 200 | 100 | 4 × 10$^{-7}$ | 3.5 × 10$^{-3}$ | Ar | Cr$_2$O$_3$ | 9.0 | 2.516 | 0.08 | 1.33E-05 | × |
| 75 | Cr$_2$O$_3$ | SiO$_2$—Na$_2$O—CaO | 200 | 100 | 1 × 10$^{-6}$ | 5 × 10$^{-3}$ | Ar | Cr$_2$O$_3$ | 12.0 | 2.566 | 0.08 | 2.00E-05 | × |
| 76 | Cr$_2$O$_3$ | SiO$_2$—Na$_2$O—CaO | 200 | 100 | 4 × 10$^{-7}$ | 5 × 10$^{-3}$ | Ar | Cr$_2$O$_3$ | 12.4 | 2.562 | 0.06 | 2.33E-05 | × |
| 77 | Cr$_2$O$_3$ | SiO$_2$—Na$_2$O—CaO | 200 | 100 | 1 × 10$^{-6}$ | 7 × 10$^{-3}$ | Ar | Cr$_2$O$_3$ | 15.6 | 2.608 | 0.05 | 2.67E-05 | × |
| 78 | Cr$_2$O$_3$ | SiO$_2$—Na$_2$O—CaO | 200 | 100 | 4 × 10$^{-7}$ | 7 × 10$^{-3}$ | Ar | Cr$_2$O$_3$ | 15.7 | 2.578 | 0.02 | 1.00E-05 | × |
| 79 | Cr$_2$O$_3$ | SiO$_2$—Na$_2$O—CaO | 200 | 100 | 1 × 10$^{-6}$ | 5 × 10$^{-3}$ | Ar + 1% O$_2$ | Cr$_2$O$_3$ | 10.3 | 2.598 | 0.07 | 1.33E-05 | × |
| 80 | Cr$_2$O$_3$ | SiO$_2$—Na$_2$O—CaO | 200 | 100 | 4 × 10$^{-7}$ | 5 × 10$^{-3}$ | Ar + 1% O$_2$ | Cr$_2$O$_3$ | 10.0 | 2.556 | 0.10 | 1.67E-05 | × |
| 81 | Cr$_2$O$_3$ | SiO$_2$—Na$_2$O—CaO | 200 | 100 | 1 × 10$^{-6}$ | 5 × 10$^{-3}$ | Ar + 5% O$_2$ | Cr$_2$O$_3$ | 9.0 | 2.590 | 0.03 | 1.33E-05 | × |
| 82 | Cr$_2$O$_3$ | SiO$_2$—Na$_2$O—CaO | 200 | 100 | 4 × 10$^{-7}$ | 5 × 10$^{-3}$ | Ar + 5% O$_2$ | Cr$_2$O$_3$ | 8.4 | 2.470 | 0.06 | 2.33E-05 | × |
| 83 | Cr$_2$O$_3$ | SiO$_2$—Na$_2$O—CaO | 200 | 100 | 1 × 10$^{-6}$ | 5 × 10$^{-3}$ | Ar + 10% O$_2$ | Cr$_2$O$_3$ | 7.4 | 2.562 | 0.08 | 1.67E-05 | × |
| 84 | Cr$_2$O$_3$ | SiO$_2$—Na$_2$O—CaO | 200 | 100 | 4 × 10$^{-7}$ | 5 × 10$^{-3}$ | Ar + 10% O$_2$ | Cr$_2$O$_3$ | 7.2 | 2.568 | 0.04 | 3.33E-06 | × |
| 85 | Fe$_2$O$_3$ | SiO$_2$—Na$_2$O—CaO | 200 | 100 | 1 × 10$^{-6}$ | 3.5 × 10$^{-3}$ | Ar | Fe$_3$O$_4$ | 8.6 | 2.501 | 0.54 | 1.33E-04 | ○ |
| 86 | Fe$_2$O$_3$ | SiO$_2$—Na$_2$O—CaO | 200 | 100 | 4 × 10$^{-7}$ | 3.5 × 10$^{-3}$ | Ar | FeO | 8.4 | 2.520 | 0.04 | 1.33E-05 | × |
| 87 | Fe$_2$O$_3$ | SiO$_2$—Na$_2$O—CaO | 200 | 100 | 1 × 10$^{-6}$ | 5 × 10$^{-3}$ | Ar | Fe$_3$O$_4$ | 10.5 | 2.500 | 0.56 | 3.33E-04 | ○ |
| 88 | Fe$_2$O$_3$ | SiO$_2$—Na$_2$O—CaO | 200 | 100 | 4 × 10$^{-7}$ | 5 × 10$^{-3}$ | Ar | FeO | 10.6 | 2.659 | 0.09 | 2.00E-05 | × |
| 89 | Fe$_2$O$_3$ | SiO$_2$—Na$_2$O—CaO | 200 | 100 | 1 × 10$^{-6}$ | 7 × 10$^{-3}$ | Ar | FeO | 10.9 | 2.577 | 0.06 | 1.33E-05 | × |
| 90 | Fe$_2$O$_3$ | SiO$_2$—Na$_2$O—CaO | 200 | 100 | 4 × 10$^{-7}$ | 7 × 10$^{-3}$ | Ar | FeO | 11.0 | 2.456 | 0.05 | 1.00E-05 | × |
| 91 | Fe$_2$O$_3$ | SiO$_2$—Na$_2$O—CaO | 200 | 100 | 1 × 10$^{-6}$ | 5 × 10$^{-3}$ | Ar + 1% O$_2$ | Fe$_3$O$_4$ | 11.8 | 2.469 | 0.58 | 3.00E-04 | ○ |

TABLE 1-continued

| No. | Target 1 | Target 2 | Sputter Power (W) Target 1 | Sputter Power (W) Target 2 | Ultimate Degree of Vacuum (Torr) | Degree of Vacuum in Sputtering (Torr) | Kind of Gas | Deposited Phase | Particle Diameter (nm) | Refraction Index ($n_0$) (633 nm) | Extinction Coefficient ($k_0$) (633 nm) | $\Delta n_T$ | Change in $n_0$ with Temperature |
|---|---|---|---|---|---|---|---|---|---|---|---|---|---|
| 92 | $Fe_2O_3$ | $SiO_2$—$Na_2O$—$CaO$ | 200 | 100 | $4 \times 10^{-7}$ | $5 \times 10^{-3}$ | Ar + 1% $O_2$ | $Fe_3O_4$ | 10.6 | 2.625 | 0.57 | 3.33E-04 | ○ |
| 93 | $Fe_2O_3$ | $SiO_2$—$Na_2O$—$CaO$ | 200 | 100 | $1 \times 10^{-6}$ | $5 \times 10^{-3}$ | Ar + 5% $O_2$ | $Fe_3O_4$ | 6.2 | 2.445 | 0.52 | 3.33E-04 | ○ |
| 94 | $Fe_2O_3$ | $SiO_2$—$Na_2O$—$CaO$ | 200 | 100 | $4 \times 10^{-7}$ | $5 \times 10^{-3}$ | Ar + 5% $O_2$ | $Fe_3O_4$ | 6.9 | 2.545 | 0.53 | 3.00E-04 | ○ |
| 95 | $Fe_2O_3$ | $SiO_2$—$Na_2O$—$CaO$ | 200 | 100 | $1 \times 10^{-6}$ | $5 \times 10^{-3}$ | Ar + 10% $O_2$ | $Fe_2O_3$ | 6.3 | 2.589 | 0.02 | 6.67E-06 | X |
| 96 | $Fe_2O_3$ | $SiO_2$—$Na_2O$—$CaO$ | 200 | 100 | $4 \times 10^{-7}$ | $5 \times 10^{-3}$ | Ar + 10% $O_2$ | $Fe_2O_3$ | 6.0 | 2.600 | 0.03 | 1.00E-05 | X |

In this Example, thin films with various compositions were formed by many combinations of No.1 and No.2 materials of a binary sputtering equipment such as transition metal oxides CoO, $Co_3O_4$, $Cr_2O_3$ and $Fe_2O_3$ for No.1 target and transition metal oxides, 50 $SiO_2$-50 $TiO_2$, soda lime glass, ($SiO_2$—$Na_2O$—$CaO$), $TeO_2$, $Al_2O_3$ and $SiO_2$ for No.2 target. These thin films have columnar crystals grown at substrate surface and about 95% by weight of target 1 composition and about 5% by weight of target 2 composition.

Sputtering conditions were changed as follows to evaluate films formed under each condition: Ultimate degree of vacuum of $1\times10^{-6}$ Torr and $4\times10^{-7}$ Torr, degree of vacuum in sputtering of $3.5\times10^{-3}$ Torr, $5\times10^{-3}$ Torr and $7\times10^{-3}$ Torr, sputter gas species of Ar, Ar+1% $O_2$, Ar+5% $O_2$ and Ar+10% $O_2$.

Deposited phases of the thin films thus obtained were identified with the wide angle X-ray diffractometer (XRD). Average particle diameter of deposited phase was evaluated with XRD and TEM (Transmission Electron Microscope). Refractive index at room temperature, $n_0$, and extinction coefficient, $k_0$, just after film formation were evaluated with an ellipsometer at 633 nm. These films were also heated in air with a heater up to 300° C. and change in refractive index was monitored with an ellipsometer. Refractive index and extinction coefficient during cooling process from 300° C. were also evaluated to judge reversibility of these values. Ranks in evaluation for refractive index are as follows: Both of temperature dependency and reversibility were observed; ○, both were remarkably observed; ⊙, reversible but small change in refractive index; Δ, temperature dependency was observed but irreversibly; X.

In addition, change in refractive index in response to temperature change, $\Delta n_T$, was evaluated as a quantitative index of change in refractive index with temperature according to the following formula:

$$\Delta n_T = \left| \frac{\Delta n}{\Delta T} \right|$$

wherein,

ΔT is temperature difference; and

Δn is amount of change in refractive index in response to temperature change of ΔT.

In order to study effects of temperature on change in refractive index and extinction coefficient, change in refractive index with substrate temperature was measured at first. Borosilicate based glass was used as a substrate. Refractive index at room temperature was 1.503, which was changed to 1.506 by heating to 325° C., indicating that the change was in such an extent as differed only in the third decimal place. Amount of change in refractive index, $\Delta n_T$, was thus calculated to be $1.0\times10^{-5}$/° C.

Figure 2:
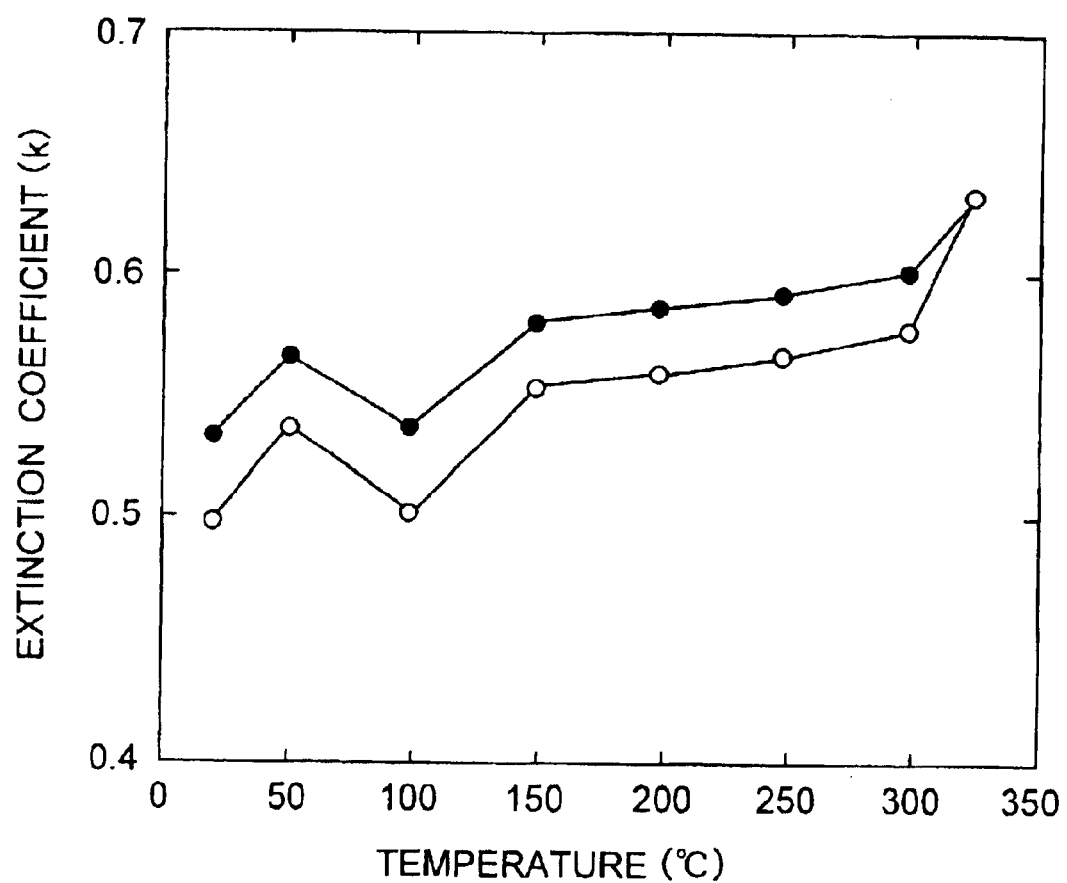
FIG. 2 shows amount of extinction coefficient change, in response to temperature, of film (No.3) of the present invention, whose refractive index changes with temperature.

FIGS. 1 and 2 show temperature dependency of refractive index and extinction coefficient of No.3 thin film in Table 1. In FIGS. 1 and 2, ○ and ● show changes in refractive index in ascending and descending temperature, respectively. Refractive index of No.3 thin film at room temperature, just after film formation, was 2.48, which lowered down to 2.42 at 325° C. with temperature increase. On cooling process, refractive index took nearly the same trajectory back to the original value, that is, refractive index of this thin film was found to be given unconditionally with temperature.

In addition, extinction coefficient increased with temperature increase from 0.5 to 0.6. On cooling process, it also took nearly the same value at each temperature back to the original value.

Figure 3:
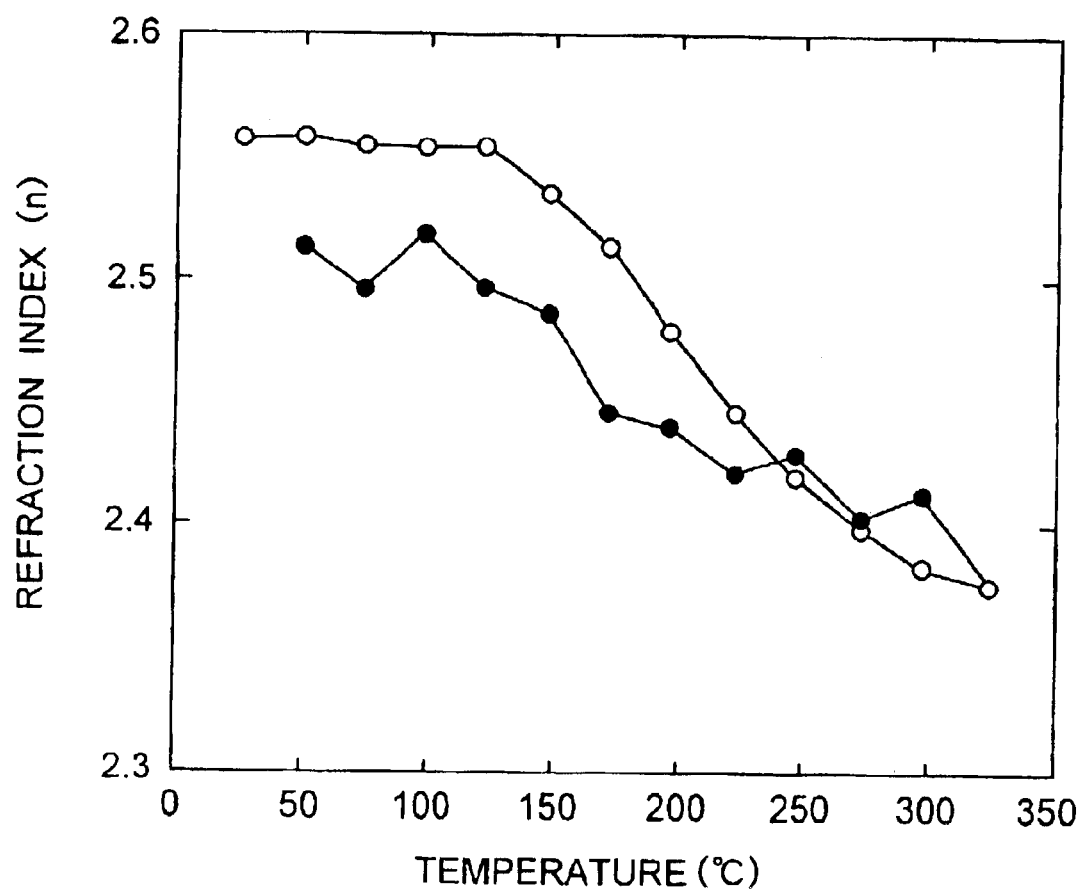
FIG. 3 shows amount of refractive index change, in response to temperature, of film (No.21) of the present invention, whose refractive index changes with temperature.
Figure 4:
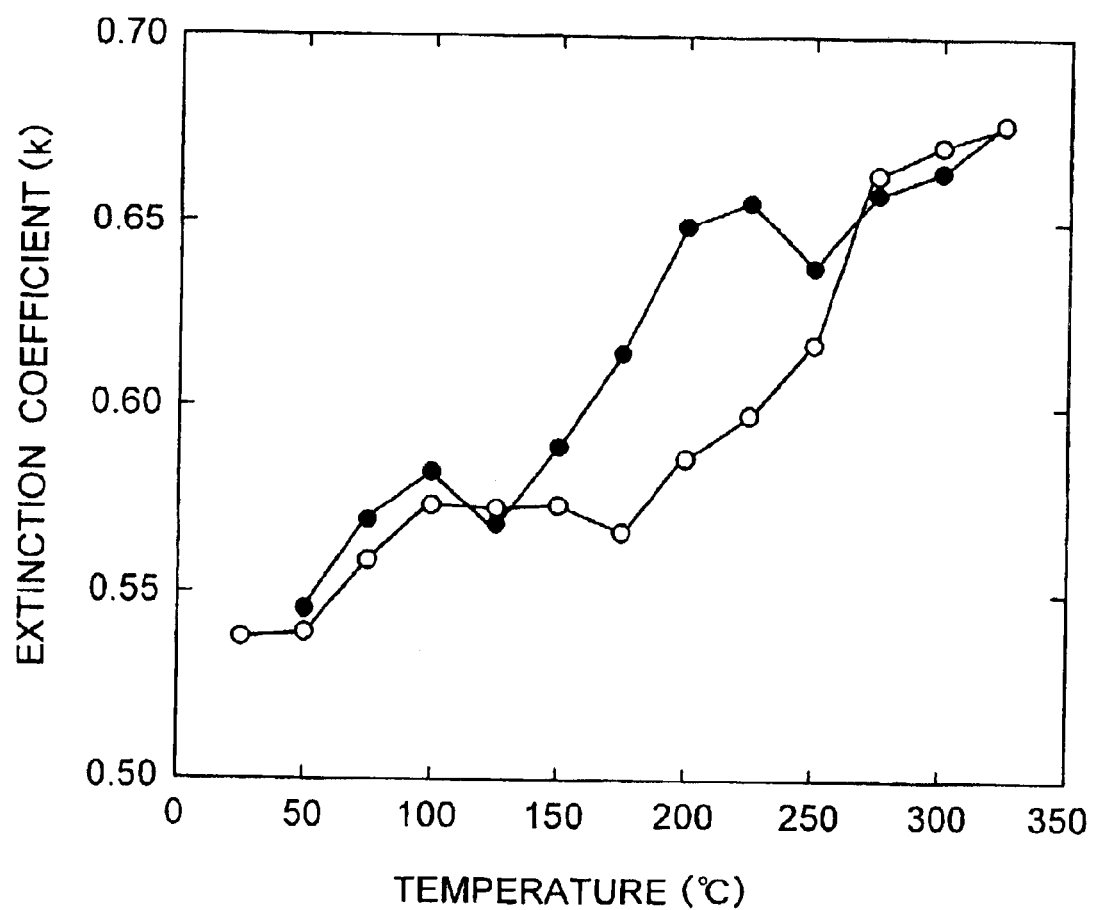
FIG. 4 shows amount of extinction coefficient change, in response to temperature, of film (No.21) of the present invention, whose refractive index changes with temperature.

FIGS. 3 and 4 show temperature dependencies of refractive index and extinction coefficient of No.21 thin film in Table 1. Just like in No.3 film, refractive index lowered down to 2.37 at 325° C. with temperature increase, which was a larger change than in No.3 film. Extinction coefficient also increased, just like in No.3 film, from about 0.5 to 0.6. Change in extinction coefficient was almost the same degree as in No.3 film and reversible.

Figure 5:
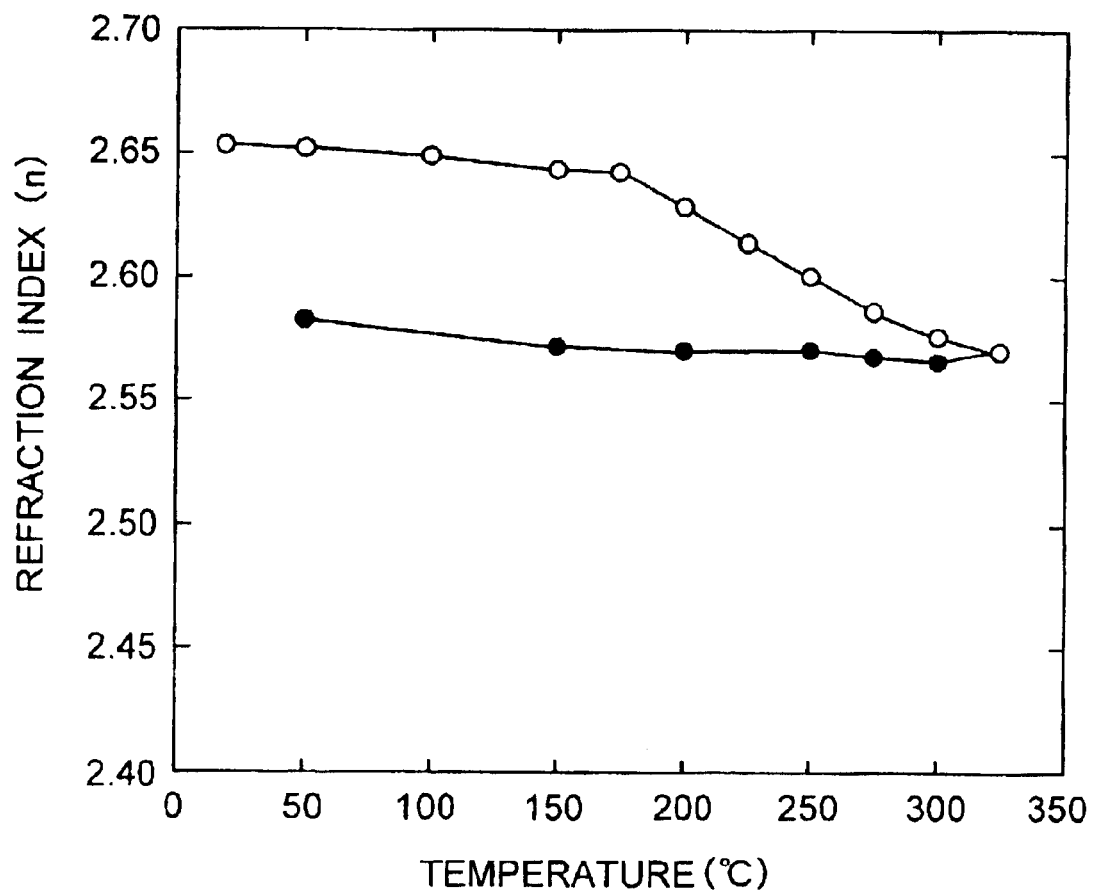
FIG. 5 shows amount of refractive index change, in response to temperature, of film (No.16) of the present invention, whose refractive index changes with temperature.
Figure 6:
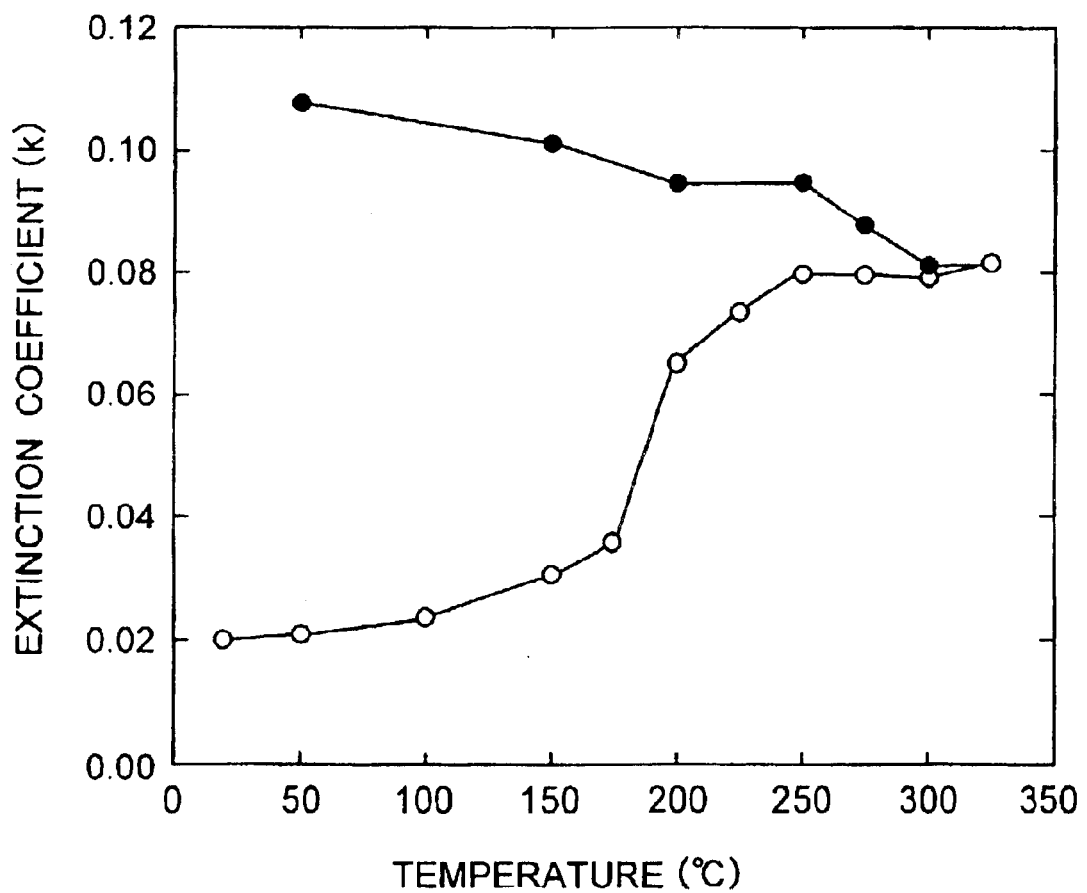
FIG. 6 shows amount of extinction coefficient change, in response to temperature, of film (No.16) of the present invention, whose refractive index changes with temperature.

FIGS. 5 and 6 show temperature dependencies of refractive index and extinction coefficient of No.16 thin film. This film showed a large change in refractive index during ascending process at about 200° C. from 2.65 down to 2.57, however, such reversibility was not observed in descending process as in FIGS. 1 and 3, and the change in refractive index was little. Similarly, extinction coefficient changed from 0.02 to about 0.08 in ascending process, however, reversibility was not observed in descending process.

Based on these results, each thin film was evaluated using $\Delta n_T$ as an evaluation index. It was found that when a very large change in refractive index was observed, $\Delta n_T$ had value not less than $2.0\times10^{-4}$/° C. When the change was small, although reversibility was observed, $\Delta n_T$ was distributed in the range from not less than $3.4\times10^{-5}$/° C. to less than $2.0\times10^{-4}$/° C. When the change was as small as that of glass substrate, the value was not higher than $5.0\times10^{-5}$/° C.

The effects of deposited phase or diameters of deposited particles on change in refractive index were similarly studied on thin films of Nos. 1–No.48 in Table 1. The result revealed that when CoO deposited as in No.16 thin film, reversible change in refractive index could not be obtained. In such thin film with $Co_3O_4$ deposited as deposited phase, reversible change in refractive index was observed just as in No.3 and No.21 films.

When $Co_3O_4$ was used as a sputtering target as in No.1–12 films, $Co_3O_4$ deposited irrespective of sputtering conditions such as ultimate degree of vacuum, degree of vacuum in sputtering and sputter gas species. On the other hand, when CoO target was used as Co source as in Nos. 13–24 thin films, it was found that CoO or $Co_3O_4$ deposited depending on sputtering conditions.

Concerning ultimate degree of vacuum, higher ultimate degree of vacuum, that is, higher concentration of residual gas in a chamber, provided a strong tendency to deposit $Co_3O_4$. This is because residual oxygen remained after vacuuming oxidizes CoO to $Co_3O_4$. When Ar gas was used, lower degree of vacuum in sputtering, that is, higher degree of vacuum, provided a strong tendency to deposit $CO_3O_4$. This is because higher degree of vacuum in sputtering increases Ar concentration in a chamber, which enhances reductive characteristics. Sputtering gas with a higher oxygen concentration provided $Co_3O_4$ deposition. This is due to oxidation by oxygen in sputtering gas.

Identifications on deposited phases of thin films with CoO deposition before and after refractive index change with temperature change using a X-ray diffraction revealed presence of a mixed phase of CoO and $Co_3O_4$ after the test. Therefore, heating in air gradually generated stable $Co_3O_4$ at the temperature not higher than 900° C. and promoted phase change, and reversible change in refractive index did not occur.

Next, an effect of particle diameter of thin film to get a large change in refractive index was studied.

Table 1 showed that change in refractive index was observed even in average particle diameter of about 8 nm–13 nm as in Nos. 1–8, however, a larger change in refractive index was found in average particle diameter of not higher than 6 nm as in Nos. 9–12 thin films. Nos. 1–8 films in Table 1, formed by changing introducing gas volume in sputtering, proved that increase in Ar gas flow volume provided a larger particle diameter of thin film formed. Values of $\Delta n_T$ of these films were found to decrease with increase in particle diameter down to abrupt decrease in $\Delta n_T$ above 13 nm. This tendency was observed also in other thin films.

Further, standard deviation of particle diameter was studied, and the standard deviation not higher than 30% of average particle diameter was found to provide a larger change in refractive index. Standard deviation of particle diameter over 30% of average particle diameter increased amount of particles with the diameter larger than average, which did not contribute to a large change in refractive index, and thus large change in refractive index as a whole could not be expected.

Based on these results, average diameter of fine particles formed is preferably not higher than 13 nm, more preferably not higher than 6 nm. Standard deviation of particle diameter is preferably not higher than 30% of average particle diameter.

Figure 7:
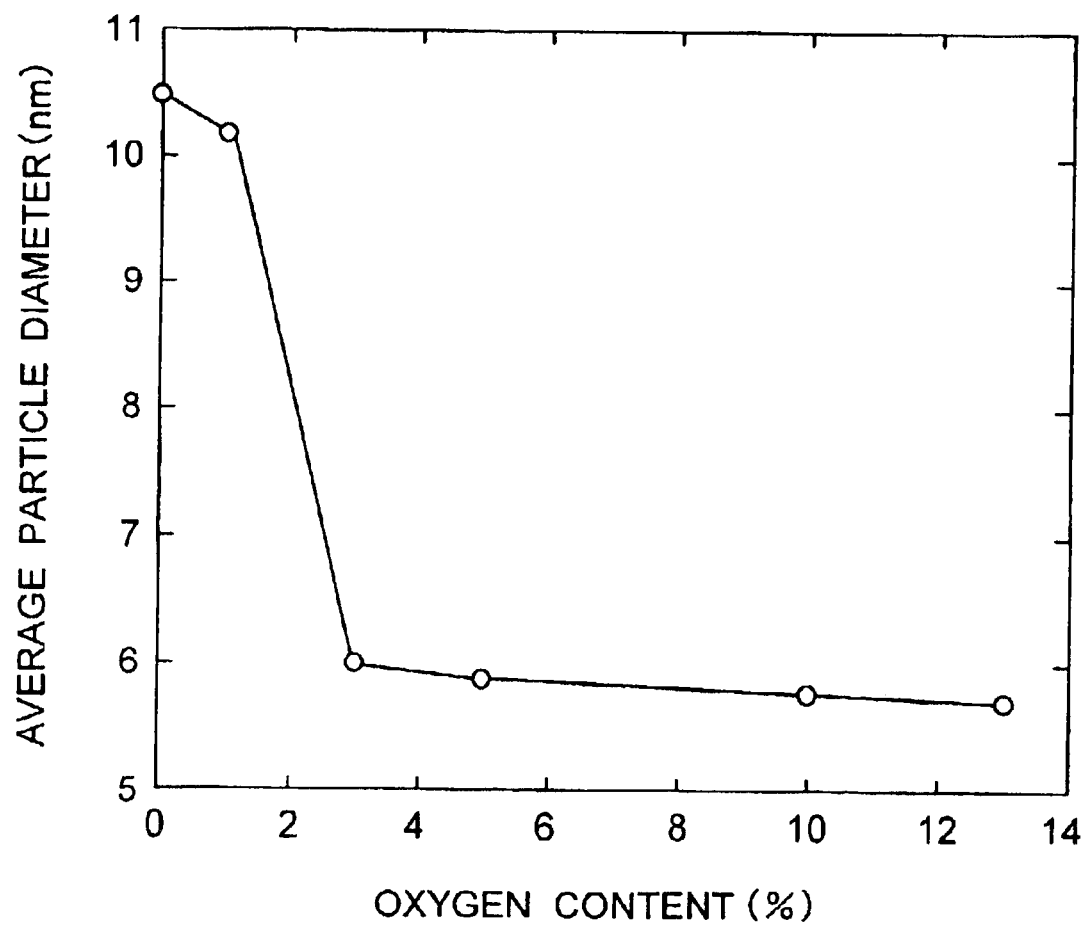
FIG. 7 shows relation between average particle diameter of film formed and oxygen concentration in sputtering gas.

Introduction of oxygen in Ar sputtering gas was effective to get such fine particles. FIG. 7 shows a relation between oxygen concentration in sputtering gas and diameter of particle deposited. Oxygen concentration lower than 3% provided nearly the same particle diameter as in sputtering with pure Ar. However, when oxygen concentration was 3% or above, size of fine particles deposited abruptly lowered down to about 5–6 nm. Therefore, oxygen concentration not less than 3% was preferable to obtain fine particles.

However, containing excess amount of oxygen significantly reduces sputtering rate and not preferable practically. FIG. 7 also shows that no further effects to reduce particle size was found with a oxygen concentration of not less than 10%. Therefore, introducing oxygen of not less than 10% only reduces sputtering rate and provides no effect to make finer particles. This concluded that oxygen concentration not lower than 3% and not higher than 10% in sputtering gas was preferable.

Such tendency was similarly observed also in Co source target materials of 50 $SiO_2$-50 $TiO_2$ and $SiO_2$—$Na_2O$—CaO. Although not shown in Examples, the same tendencies were observed as in Examples even when a part of or all of alkaline and alkaline earth metal oxides, constituting No. 2 target, in Nos. 25–48 thin films were substituted by $K_2O$, $Li_2O$, MgO, SrO, BaO and the like. Therefore, alkaline and alkaline earth metals could be treated interchangeably.

Other materials were also studied. Thin films were prepared by setting $Co_3O_4$ and $TeO_2$ as target 1 and target 2, respectively. In this case, use of Ar or Ar+1% $O_2$ of sputtering gas as in No. 49–56 thin films could not form uniform thin films due to reduction of $TeO_2$ to Te metal as residue in a chamber. Reduction of $TeO_2$ became not to occur as oxygen concentration in sputtering gas was increased to 5% or 10% as in No. 57–60 thin films, and thus uniform thin films were obtained. Identification of deposited phase with X-ray diffraction showed no significant crystal peak and showed to be amorphous. Refractive index of these materials gradually lowered down to about 4% in reversible manner.

Nos. 61–66 thin films were prepared by using $Al_2O_3$ as a target material of Co oxide. Deposited phases in Nos. 61–64 films were CoO, when sputtering gas was Ar or Ar+1% $O_2$, notwithstanding of using $Co_3O_4$ as Co source target, and did not show reversibility in a change in refractive index with temperature as the examples described above. When oxygen concentration was increased to 5% and 10% in No. 65 and 66 thin films, $Co_3O_4$ deposited and a large change in refractive index was obtained.

Moreover, when $SiO_2$ was used as a target material (Nos. 65–72), CoO deposited even by containing oxygen of not less than 5% in sputtering gas and reversible change in refractive index could not be obtained.

Then Cr and Fe were used as substitution for a transition metal Co. Use of Cr as a transition metal deposited $Cr_2O_3$ which gave little change in refractive index with temperature.

Use of $Fe_2O_3$ provided various deposited phases depending on sputtering gas species, and sputtering with pure Ar reduced $Fe_2O_3$ to $Fe_3O_4$ a little, providing reversible change in refractive index similarly as in $Co_3O_4$. Sputtering in a sputtering gas containing oxygen in amount of 1–5% deposited $Fe_2O_3$, which did not show a change in refractive index just like in $Cr_2O_3$. Sputtering with Ar+10% $O_2$ deposited FeO which again did not show a change in refractive index.

These findings showed that thin films containing oxides with a spinel structure such as $Co_3O_4$ and $Fe_3O_4$ gave a significant change in refractive index. Furthermore, particle diameter not larger than 6 nm provided still larger change in refractive index. Even in other deposited phase such as $Co_3O_4$—$TeO_2$, change in refractive index was observed. A large change in refractive index could not be obtained in other deposited phase.

Observation of fine structures of thin films with deposition of $Co_3O_4$ and $Fe_3O_4$ with a transmission electron microscope (TEM) revealed that they were assemblies of columnar crystals with a uniform average particle diameter of not higher than 10 nm. Presence of grain boundary phase was also observed with about 1 nm width among particles. Composition analysis with an energy dispersive type characteristic X-ray spectrum (EDS) revealed that Si, Ti, Na and Ca added were present both inside the particles and at grain boundary, in the former being up to about 5%.

In addition, thin films showing a large change in refractive index with temperature had a tendency to show a large extinction coefficient just after film formation and strong color. Many electronic defects in crystal are considered to cause this strong color. Since spinel has a open structure and a valence change easily occur, color was stronger compared with CoO, which had a structure with little valence change like NaCl structure.

Electronic state at high temperature was evaluated with a high temperature XPS. XPS analysis adopts high vacuum, which may cause a change in an electronic state of thin films by heating under vacuum. To avoid this, films were heated under vacuum with an interception of in and out flow of oxygen by forming a dense carbon film of 10 nm thick on the thin films. However, 10 nm thick dense carbon film formed blocks information of the thin films because analysis depth with XPS is as shallow as 4–5 nm. Therefore, after completion of heating and just before XPS analysis, the carbon film thickness was reduced to about 1 nm by Ar sputtering.

The results revealed that tricobalt tetraoxide released oxygen by dissociating from Co and divalent component increased with temperature increase. It then gave a large polarization and a change in refractive index.

Presence of these impurities in crystal and that particle diameter as small as quantum size, such as several nm, provides a vulnerability of electron orbital with exterior field, are considered to provide polarization and change in refractive index with temperature. Since such quantum effects abruptly attenuated when diameter of particle formed became over 13 nm, the average diameter of fine particles was preferably not higher than 13 nm.

The change in material state like this brought about a larger change in refractive index than the change caused by lowering of density with heat described above. Therefore this change is essentially different from conventional lowering of refractive index by density lowering.

Further, semiconductor materials such as PbS, ZnS and ZnSe, which are known examples, also shows a large change in refractive index, but its maximum level reported is $1.5 \times 10^{-4}/°$ C., which can not be said to be a large enough change.

Figure 10:
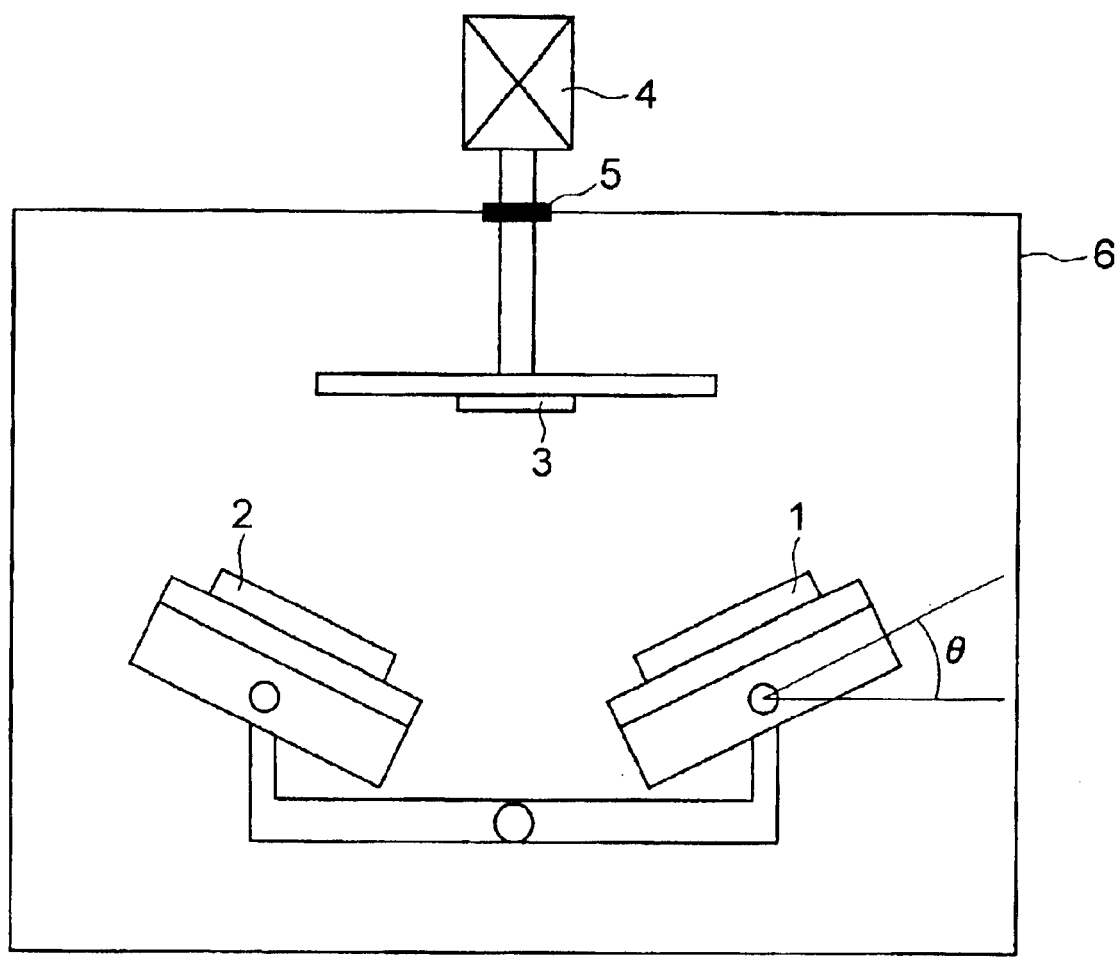
FIG. 10 shows a schematic drawing of sputtering equipment used in the present invention.
Figure 11:
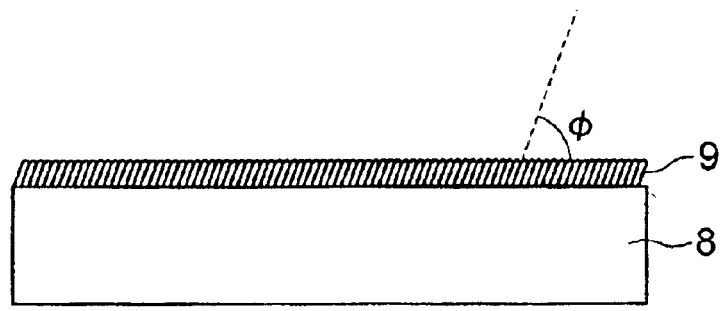
FIG. 11 shows relative position of growth direction of a film formed to a substrate.

In addition, sputtering equipment used in this example can change an angle between target and horizontal plane (target angle) from 0 degree to 60 degree. Using this equipment, a relation between growth direction of film formed and target angle was studied. A film was formed under conditions for No.12 film in Table 1. FIG. 10 shows geometrical configuration of target angle and FIG. 11 is a schematic diagram showing the relation between a growth direction of film formed and a substrate. In FIG. 10, 1 and 2 express targets, 3 is a substrate, 4 is a rotation motor to rotate a substrate, 5 is vacuum sealing section to maintain vacuum, 6 is a vacuum chamber and 7 is angle adjustment mechanism to change target angle θ against horizontal plane. θ was changed from 0 degree to 60 degree by adjusting 7.

In FIG. 11, 8 is a substrate to form a thin film and 9 is a thin film formed having a refractive index changeable with temperature. Thin film was found to grow, as shown in FIG. 11, with angle φ against substrate surface, wherein φ is an angle measured so that the angle becomes minimum against interface.

φ for the above θ was found to be determined by the following formula:

$$\phi = 90 \text{ degree} - \theta$$

When target angle θ was not less than 45 degree, however, film growth rate lowered significantly and film thickness per unit time (sputtering rate) became very low. From this fact, θ not less than 45 degree is not practically preferable. Therefore, if an angle of film formed is in a range of 45 degree–90 degree, formation of a film in a practically preferable range was possible.

In addition, evaluation results of change in refractive index with temperature of thin films formed at various angles revealed that change in refractive index was nearly constant irrespective of growth angle of the film formed. This fact showed that practically preferable range of characteristics could be obtained with φ in the range of 45 degree–90 degree.

From the above results, in order to deposit $Co_3O_4$, it is preferable to use $Co_3O_4$ as a target material and $SiO_2$—$TiO_2$, $SiO_2$—$Na_2O$—$CaO$ and $Al_2O_3$ or substances substituted for alkaline and alkaline earth metal oxide components of these materials with $K_2O$, $Li_2O$, $MgO$, $SrO$, $BaO$ and the like as a pair material of $Co_3O_4$ and $Fe_3O_4$.

$Fe_3O_4$, in particular, could be deposited by using $Fe_2O_3$ as a target and sputtering under a mild reductive condition. In the case of sputtering with RF, since induction is deformed by magnetic field of $Fe_3O_4$ if $Fe_3O_4$ is used as a target, sputtering can not be performed. Therefore, use of $Fe_3O_4$ as a target was not suitable.

Figure 8:
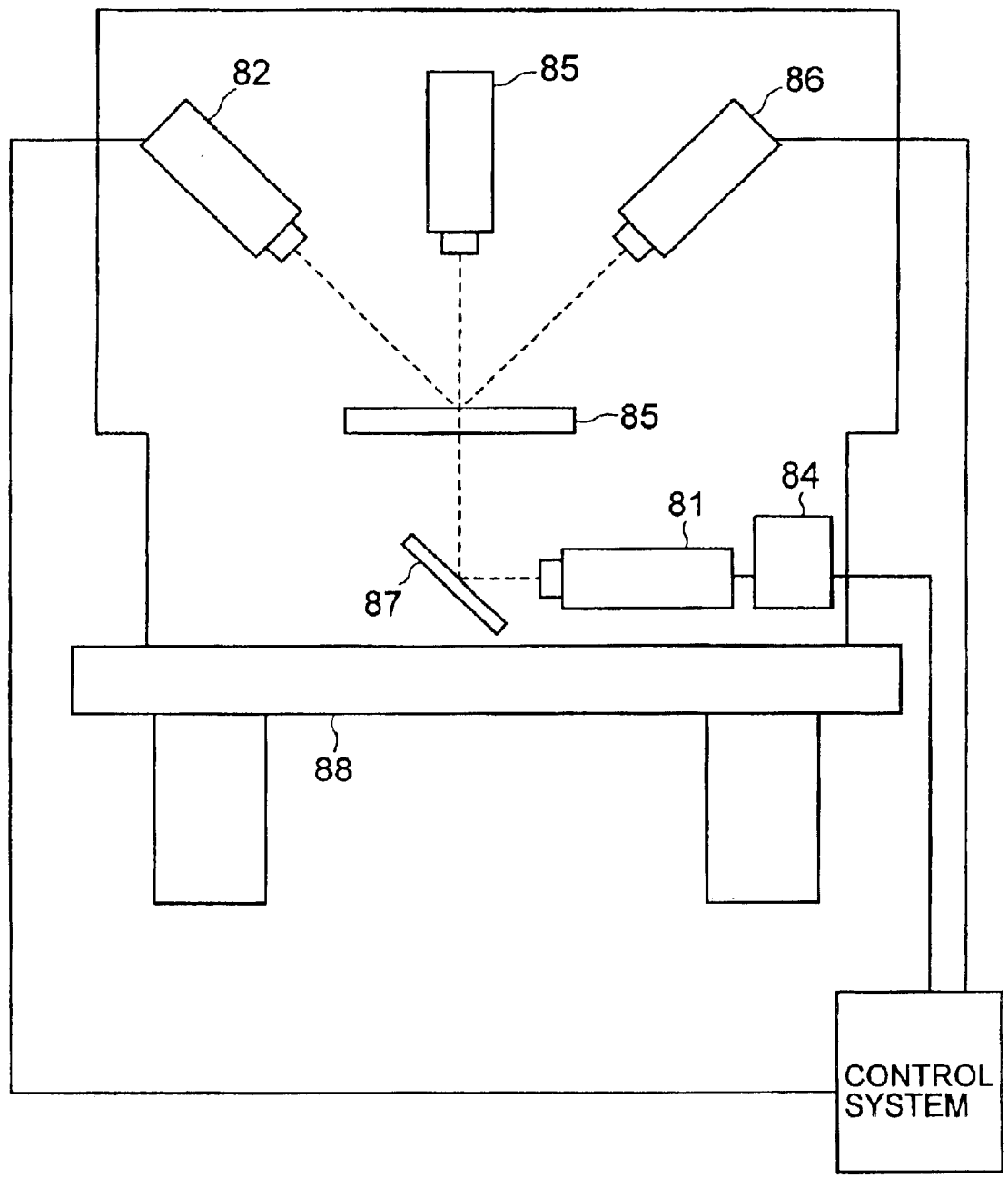
FIG. 8 shows a schematic diagram of evaluation equipment of time response of film of the present invention, whose refractive index changes with temperature.

Then time response characteristics of change in refractive index was evaluated using No.12 thin film with $Co_3O_4$ deposited, showing a large change in refractive index above. FIG. 8 shows an outline of time response measurement equipment. In FIG. 8, 81 is a laser light source for excitation, 82 is a laser light source for measurement, 83 is a sample holder, 84 is a shutter of laser light for excitation, 85 is a CCD camera for beam observation, 86 is a light receiving detection equipment for measurement light, 87 is an optical system of excited light and 88 is a vibration insulating stand.

Laser light for excitation 81 was irradiated as a transmission light to a sample from its backside surface. This excitation light was converted to pulse of ns–μs order by a shutter 84 and irradiated to a sample. In this example, wavelength of laser light irradiated to a sample was 650 nm and laser power was varied between 1 mW to 35 mW. On the other hand, laser for measurement was irradiated as continuous light from upper surface of a sample and its reflected light was introduced to light receiving detection equipment. Extinction coefficient of refractive index can be calculated from amount of two reflected lights of p and s polarized lights. Change in an amount of reflected light was monitored at 5 ns interval with light receiving equipment and change in refractive index before and after receiving excitation incident light was monitored at 5 ns interval. All of these were measured on a vibration insulation stand 88 and processed comprehensively from data intake to calculation by a data processing mechanism.

Figure 9:
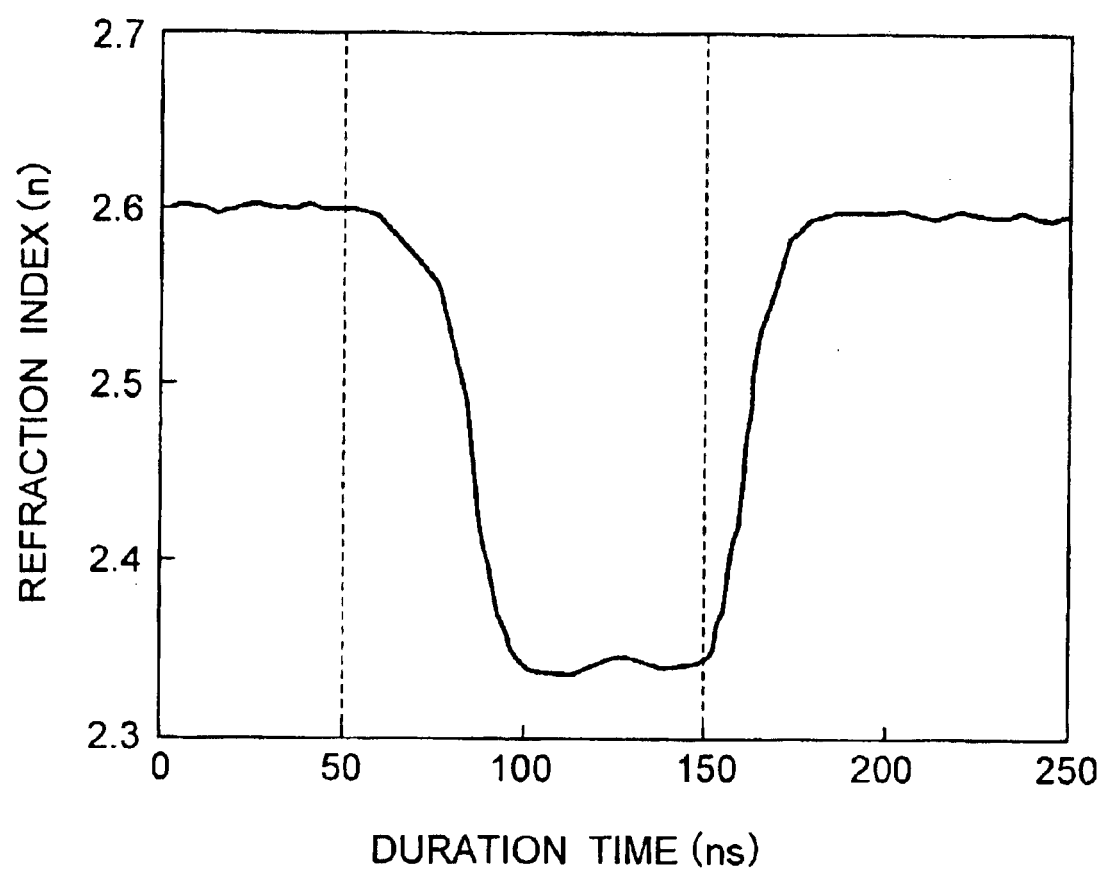
FIG. 9 shows temperature response of refractive index of film of the present invention, whose refractive index changes with temperature.

FIG. 9 shows a time change in refractive index of No.12 thin film evaluated by equipment shown in FIG. 8. Refractive index began to decrease from 25 ns after irradiation of excitation light down to about 2.35 after 50 ns, about the same value obtained with heated ellipsometer and then saturated. Refractive index began to increase gradually up to an original level after stopping irradiation of excitation light. It again took about 50 ns from stopping of excitation light to returning of refractive index to the original level.

Based on these facts, response time of refractive index was judged to be bout 50 ns. Film temperature when irradiated with excitation light of 5 mW was calculated to be about 317° C. based on incident light intensity and absorption coefficient, thermal conductivity and heat capacity of the film, which was nearly in agreement with the range of temperature change of a sample studied in FIGS. 1–6. This fact revealed that refractive index of this film changed with temperature and the response time was in the order of 50 ns.

Then $Co_3O_4$ composition to obtain a large change in refractive index was studied using various concentration of $Co_3O_4$ in film by changing sputtering power ratio between target 1 and target 2. Table 2 shows the following evaluation results: Sputtering power ratio for thin films prepared, composition determined with EDS, deposited phase of thin films obtained, their particle diameter, refractive index, extinction coefficient, $\Delta n_T$ and change in refractive index with temperature.

TABLE 2

| No. | Target 1 | Target 2 | Sputter Power Ratio Target 1 | Sputter Power Ratio Target 2 | EDS Composition $Co_3O_4$ | EDS Composition $SiO_2$ | EDS Composition $TiO_2$ | Deposited Phase | Particle Diameter (nm) | Refraction Index ($n_0$) (633 nm) | Extinction Coefficient ($k_0$) (633 nm) | $\Delta n_T$ | Change in $n_0$ with Temperature |
|---|---|---|---|---|---|---|---|---|---|---|---|---|---|
| 97  | $Co_3O_4$ | $50SiO_2$—$50TiO_2$ | 100 | 0   | 100 | 0   | 0   | $Co_3O_4$ | 10.5 | 2.698 | 0.68 | 1.67E−04 | Δ |
| 98  | $Co_3O_4$ | $50SiO_2$—$50TiO_2$ | 80  | 20  | 97  | 1.2 | 1.8 | $Co_3O_4$ | 10.7 | 2.690 | 0.60 | 1.83E−04 | Δ |
| 99  | $Co_3O_4$ | $50SiO_2$—$50TiO_2$ | 75  | 25  | 95  | 2.2 | 2.8 | $Co_3O_4$ | 10.2 | 2.537 | 0.57 | 1.93E−04 | Δ |
| 100 | $Co_3O_4$ | $50SiO_2$—$50TiO_2$ | 67  | 33  | 91  | 4   | 5   | $Co_3O_4$ | 10.3 | 2.562 | 0.56 | 3.00E−04 | ○ |
| 101 | $Co_3O_4$ | $50SiO_2$—$50TiO_2$ | 60  | 40  | 80  | 8   | 12  | $Co_3O_4$ | 10.1 | 2.560 | 0.50 | 2.67E−04 | ○ |
| 102 | $Co_3O_4$ | $50SiO_2$—$50TiO_2$ | 55  | 45  | 62  | 11  | 27  | $Co_3O_4$ | 10.8 | 2.500 | 0.48 | 2.67E−04 | ○ |
| 103 | $Co_3O_4$ | $50SiO_2$—$50TiO_2$ | 52  | 48  | 59  | 13  | 28  | $Co_3O_4$ | 10.5 | 2.401 | 0.38 | 1.67E−04 | Δ |
| 104 | $Co_3O_4$ | $50SiO_2$—$50TiO_2$ | 50  | 50  | 47  | 23  | 30  | $Co_3O_4$ | 10.1 | 2.421 | 0.34 | 6.67E−05 | Δ |
| 105 | $Co_3O_4$ | $50SiO_2$—$50TiO_2$ | 37  | 63  | 30  | 30  | 40  | $Co_3O_4$ | 10.0 | 2.421 | 0.31 | 3.33E−05 | Δ |
| 106 | $Co_3O_4$ | $50SiO_2$—$50TiO_2$ | 40  | 60  | 27  | 31  | 42  | —         | —    | 2.210 | 0.07 | 6.67E−06 | X |
| 107 | $Co_3O_4$ | $50SiO_2$—$50TiO_2$ | 33  | 67  | 15  | 38  | 47  | —         | —    | 2.210 | 0.04 | 1.67E−05 | X |
| 108 | $Co_3O_4$ | $50SiO_2$—$50TiO_2$ | 25  | 75  | 3   | 42  | 55  | —         | —    | 2.190 | 0.01 | 6.67E−06 | X |
| 109 | $Co_3O_4$ | $50SiO_2$—$50TiO_2$ | 0   | 100 | 0   | 45  | 55  | —         | —    | 1.980 | 0.00 | 3.33E−06 | X |

EDS composition was analyzed in an area of about 1 μm diameter by widening a beam. In this example, $Co_3O_4$ and $50\ SiO_2$-$50\ TiO_2$ were used as targets and composition was changed by altering sputtering power ratio. Sputtering conditions used were: Ultimate degree of vacuum of $1.0\times10^{-6}$ Torr, degree of vacuum in sputtering of $5.0\times10^{-3}$ Torr and sputtering gas of pure Ar.

A Co concentration in a thin film gradually lowered with decrease in $Co_3O_4$ ratio. Although fine $Co_3O_4$ particles were deposited in Nos. 97–105 thin films, such fine particles were not formed in No. 106–109 thin films. In such cases, films seemed to give small refractive index and also small extinction coefficient, along with high transparency. Furthermore, $\Delta n_T$ of these films were found to be very small and changes in refractive index were small.

On the other hand, particle diameters of fine particles formed in Nos. 97–105 were about 10 nm, but number of fine particles deposited was found to increase with higher concentration of $Co_3O_4$. More detailed analysis of fine structure revealed that in Nos. 97–102 thin films, $Co_3O_4$ crystals deposited in columnar in perpendicular to a substrate, but in Nos. 103–105, they were globular crystals. Study on a relation between such structure and change in refractive index with temperature revealed that the case deposited with columnar fine particles provided a good change in refractive index, but the case of globular particles gave a smaller change in refractive index.

No. 97 and No. 98 thin films did not show a preferable change in refractive index, although they formed the above described columnar crystals. Detailed analysis of TEM photographs revealed that grain boundary phase of about 1–2 nm width was present at an inter-particle interface in No. 99–101, but there was no such grain boundary phase in No. 97 and No. 98. In No. 98, all of Si and Ti were found as a solid solution in $Co_3O_4$.

These facts revealed that columnar particles of about 10 nm diameter and the presence of interparticle grain boundary phase were necessary to obtain a large change in refractive index.

In conclusion, it was preferable that fine particles formed were columnar crystals and interparticle grain boundary phase was present. Furthermore, to attain such structure, it was preferable that $Co_3O_4$ composition was not lower than 60% by weight and not higher than 95% by weight. When $Co_3O_4$ composition was lower than 60% by weight, columnar particles were not formed but became globular, resulting in no large change in refractive index. Furthermore, when $Co_3O_4$ composition was larger than 95% by weight, grain boundary phase was not formed, making it difficult to obtain a large change in refractive index.

Example 2

Figure 12:
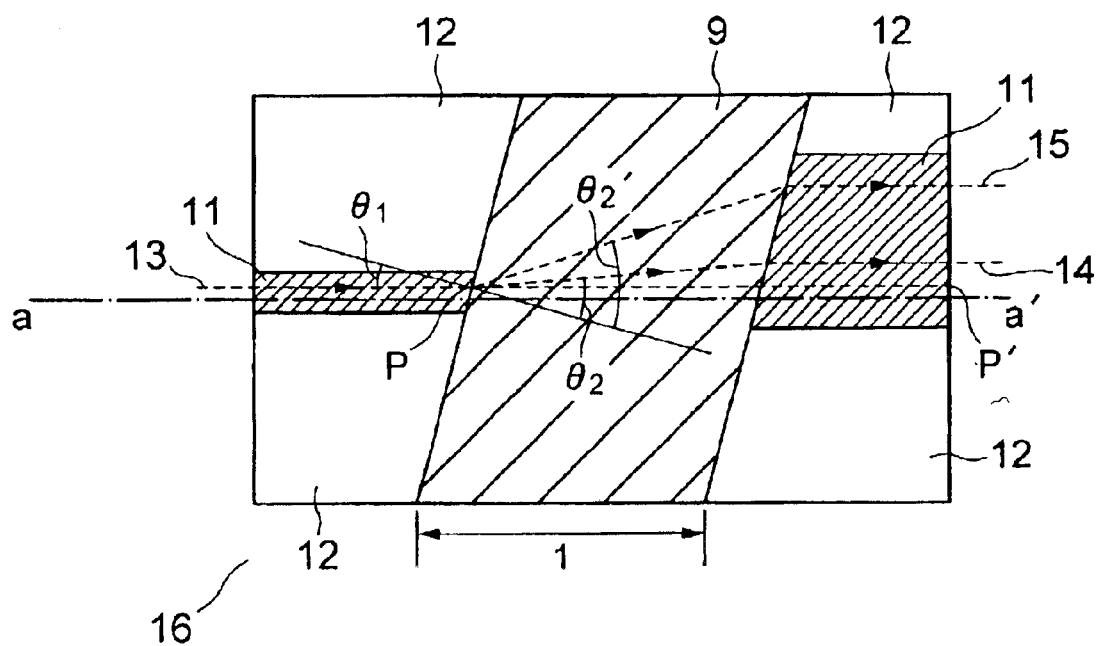
FIG. 12 shows a plane view of schematic drawing of optical switch produced in accordance with the present invention.
Figure 13:
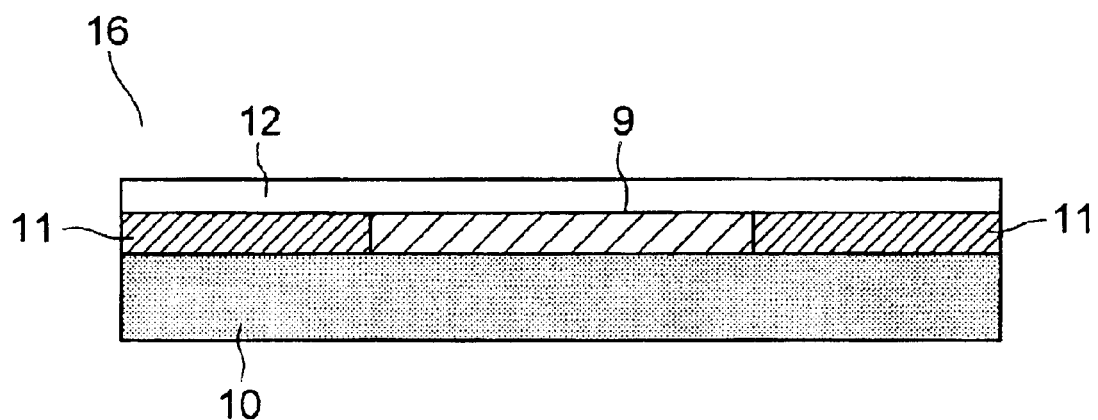
FIG. 13 shows cross-sectional view of optical switch shown in FIG. 12.
Figure 14:
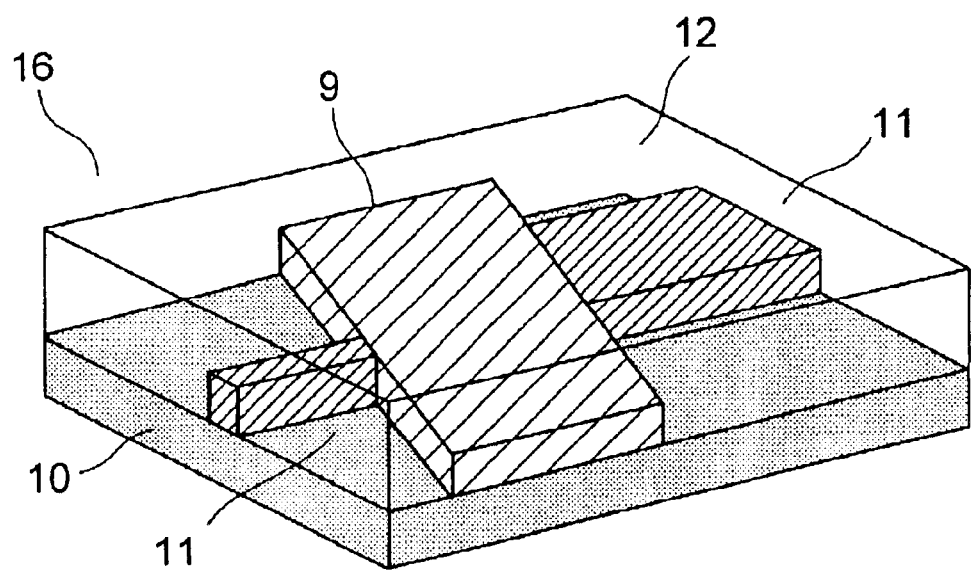
FIG. 14 shows bird's-eye view of optical switch shown by FIG. 12.

FIGS. 12–14 are schematic diagrams of optical switches of light waveguide type prepared using a thin film of example 1. FIG. 12 is a plane view and FIG. 13 is a cross-sectional view cut by a–a' plane of FIG. 12, and FIG. 14 is a bird's eye view. In FIGS. 12–14, 9 is a film having refractive index changeable with temperature, 10 is a substrate, 11 is a core section of light waveguide, 12 is a clad section of light waveguide, 13 is incident light, 14 and 15 are outgoing light and 16 is a total view of optical switch.

Figure 17:
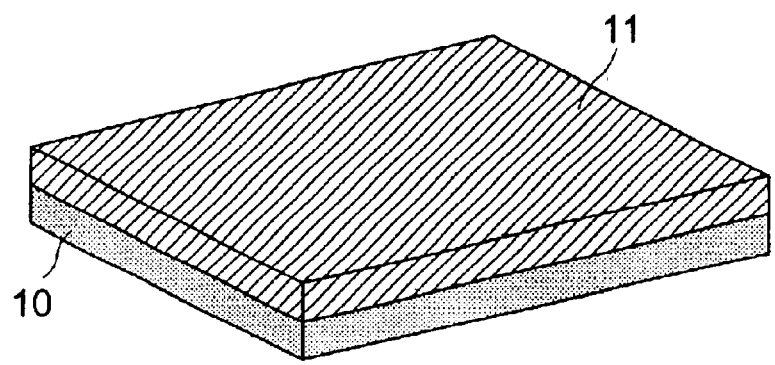
FIGS. 17–19 show production procedures of optical switch shown in FIG. 12.
Figure 18:
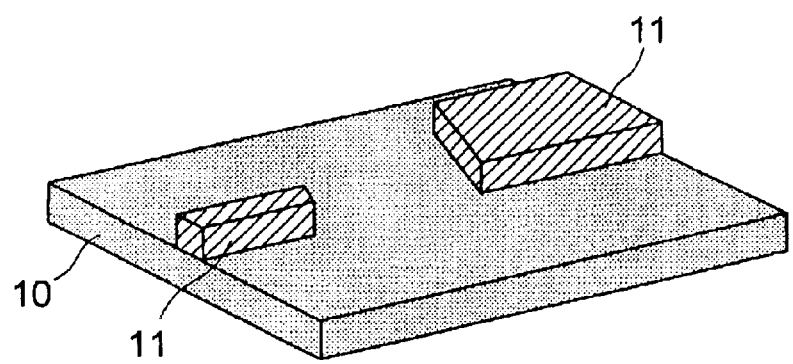
Figure 19:
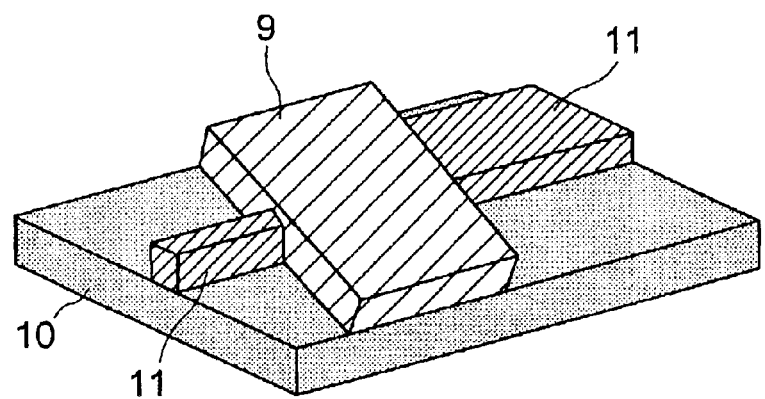

FIGS. 17–19 show schematic diagrams of a production method for optical switch shown in FIGS. 12–14. Quartz glass with a high refractive index was formed in soot shape on a substrate 10 as a core section of light waveguide by flame-deposition method, followed by densification by thermal treatment to obtain a core section 11 of transparent light waveguide. Film thickness after densification was about 8 μm and a single mode light waveguide was obtained (FIG. 17).

Ge was doped in the core section to provide a high refractive index. Then light waveguide was formed by coating with amorphous silicon under masking light waveguide section, followed by removing excess core part by a reactive ion etching method to give a core section. Width of the core section was also 8 μm (FIG. 18).

Then refractive index changeable section 9 was prepared by film formation using reactive sputtering after masking the core section formed as in FIG. 17 so that the refractive index changeable section was not sputtered. In this example, No.21 thin film was used as a refractive index changeable section. Film thickness including the core section was 8 μm. Sintered metal consisted of Co—Si—Ti was used as a target material of reactive sputtering and fast sputtering rate was obtained by introducing oxygen in film formation. Sputtering rate in this condition was about 50 nm/min. Masking was removed after sputtering to obtain a part of material of FIG. 19 having a refractive index changeable section.

Then clad section 12 made of non-doped quartz glass was formed by a flame-deposition method, followed by firing for densification to obtain an optical switching element shown in FIGS. 12–14.

In FIG. 12, 1 is length of film, having a refractive index changeable with temperature in the direction of optical pass.

In this example, 1 was 20 mm. Incident light 13 is introduced, through the core section 11 of light waveguide at an incident angle of $\theta_1$, into a refractive index changeable film 9. The following formulas hold among incident angle $\theta_1$ and refractive angles in film $\theta_2$ and $\theta_{2'}$, based on Snell rule:

$$\frac{n_1}{n_0} = \frac{\sin\theta_1}{\sin\theta_2}$$

$$\frac{n_2}{n_0} = \frac{\sin\theta_1}{\sin\theta_2}$$

wherein, $n_1$ and $n_2$ are refractive indices of film having a refractive index changeable with temperature, at room temperature and high temperature, respectively, and $\theta_2$ and $\theta_{2'}$, are refractive angles in each case and $n_0$ is refractive index of a core part of light waveguide.

In this example, $n_0$=1.590 and refractive index $n_1$ at 25° C. was 2.55 and $n_2$ at 325° C. was 2.37, because No.21 thin film was used. In this example, incident angle $\theta_1$ was set at 20 degree. Under this condition, outgoing light 14 at room temperature was detected at the position of 4.26 mm apart from point p' based on p–p' axis, which is a line started from an entrance point p of incident light and extended along the optical axis. On the other hand, result of the same measurement by heating the whole at 325° C. showed detection of outgoing light at 4.60 mm from point p'. Thus, the point of outgoing light could be changed by about 350 $\mu$m between room temperature and 325° C.

Figure 15:
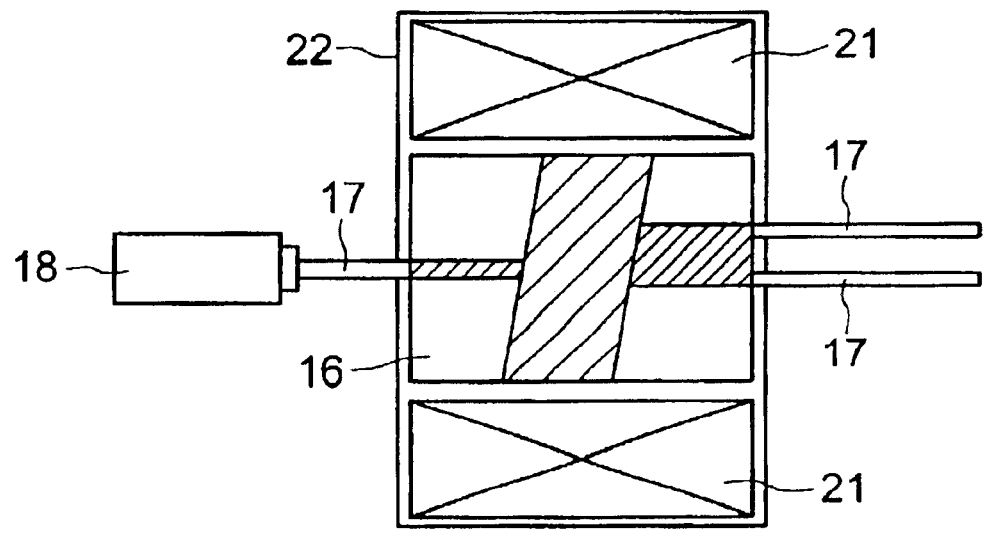
FIGS. 15 and 16 show schematic diagrams of an example of temperature responsive optical switch produced in accordance with the present invention.

An optical switch device responsive to temperature was prepared by installing this optical switch in the device equipped with a heating device as shown in FIG. 15. In FIG. 15, 16 is an optical switch, 17 is an optical fiber and a connector section to introduce incident light and outgoing light, 18 is a light source, 21 is a heating device and 22 is an insulation wall for thermal insulation from exterior field so as to retain the whole equipment at an uniform temperature.

In this example, 633 nm He—Ne laser, white light source, Ar and Kr gas lasers were used as the light source 18, and in all cases, it was possible to introduce light with a spatial resolution detectable by different sensors depending on temperature change by changing position 17 of outgoing light.

Figure 16:
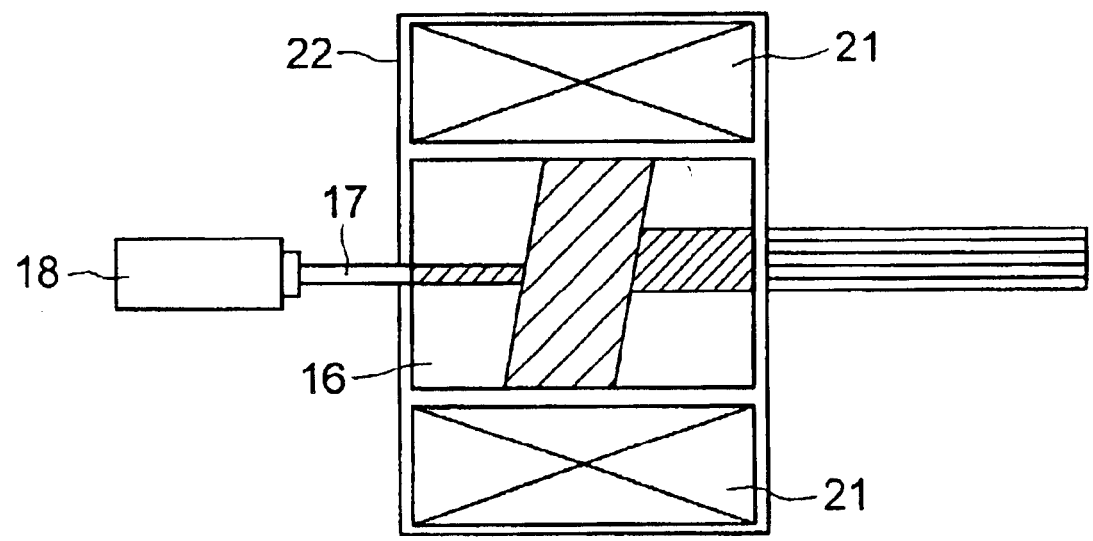

Further, elements which have many exits at outgoing light port, as shown in FIG. 16, were also prepared. Twenty five of optical fibers with a diameter of 20 $\mu$m were arranged at the exits without space on which a resin was molded. As a result, this element required an amount of change in refractive index, $\Delta n$, of 0.004 to branch a light in a resolution of 20 $\mu$m, and in the case of No.21 thin film, switching for 25 circuits was found to be possible under a temperature control by about 10° C. Number of circuits could be increased in proportion to the length 1 of the refractive index change section 9.

Furthermore, response time against temperature change was studied in an optical sensor as shown in FIGS. 15 and 16, and was found to be about 50 ns against temperature change for switching.

As shown by the above results, it was found that an optical sensor in accordance with the present invention had a fast response time even in the case having a large number of circuits.

In a preparation of an optical sensor based on temperature as described above, a sensor which has a small $\Delta n_T$, and requires a large temperature change width was not preferable because sensor itself needs to have a high heat resistance. More specifically, when an element is in a high temperature above 500° C., even a superior heat resistant substrate such as Si and quartz glass begins to deform, and therefore such element was not preferable.

In addition, when resolution of an element requires a spatial position of outgoing light to be apart by about 100 $\mu$m due to its sensitivity, and element length along optical pass is required to be limited to about 20 mm, an element with $\Delta n_T$ below 2.0×10$^{-4}$/° C. could not provide a sufficient resolution to make switching possible with AT of around 300° C. Thin film with $\Delta n_T$ not less than 2.0×10$^{-4}$/° C. provided a sufficient resolution by heating up to around the heat resistant temperature.

From above results, a range of $\Delta n_T$ of a thin film material to be used for this element was preferably not less than 2.0×10$^{-4}$/° C. And from an evaluation on response time, change in refractive index was found to be able to response to temperature change without delay, if response time was not longer than about 1.0×10$^{-7}$ second.

Further, optical switches of FIG. 12 were prepared using various films shown in Table 1 having variable refractive indices, and their characteristics were evaluated. The films used were those of which refractive indices changed with temperature in reversible manner (those marked with ⊚ and ○ in Table 1). Results are shown in Table 3.

TABLE 3

| No. | $\Delta n_T$ | $\tau$ (ns) | Switching performance |
|---|---|---|---|
| 6 | 1.28E-04 | 25 | ○ |
| 10 | 2.01E-04 | 28 | ○ |
| 19 | 1.35E-04 | 23 | ○ |
| 21 | 1.96E-04 | 26 | ○ |
| 36 | 1.82E-04 | 57 | ○ |
| 39 | 1.00E-04 | 45 | ○ |
| 60 | 1.08E-04 | 66 | ○ |
| 66 | 1.28E-04 | 104 | Δ |
| 85 | 1.33E-04 | 95 | ○ |

In Table 3, No. expresses number of film, $\Delta n_T$ is an amount of change in refractive index per unit temperature change, $\tau$ is a response time of change in refractive index against temperature change, which was measured as a period from a time when temperature reached a desired value to a time when change in refractive index showed saturation. Switching performance was shown as follows: ○ was the case when switching occurred actually, and Δ was the case when switching occurred but with delay. As shown in Table 3, switching phenomena were observed in all of the thin films. However, when No. 66 thin film was used, switching response was slow and signal change within a nano-second order was difficult.

From above results, amount of change in refractive index per unit temperature change, $\Delta n_T$, for use of optical switch was preferably not less than 1.0×10$^{-5}$/° C., and response time for a change in refractive index from original value to a value after the change was preferably not longer than 100 nm second.

Example 3

Figure 20:
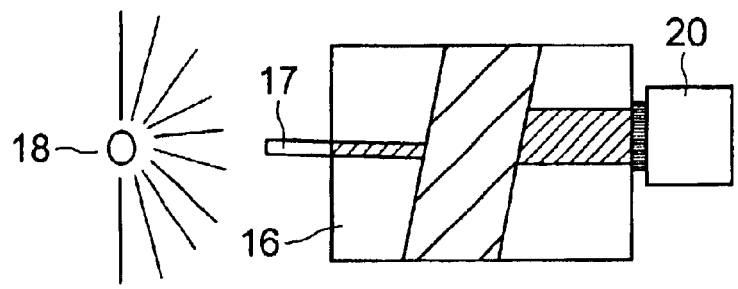
FIGS. 20 and 21 show plane vies of temperature sensors produced in accordance with the present invention.

Then, a temperature sensor was prepared by fitting up a light receiving element with a light receiving area of 3 $\mu$m, instead of optical fiber, at a light receiving side of the element shown in FIG. 12. FIG. 20 shows a schematic drawing of temperature sensor prepared. In FIG. 20, 16 is an optically functional element, 18 is a light source, 17 is an optical fiber to guide an incident light and 20 is a light receiving element. Structure of optical element 16 is completely the same composition as that shown in FIG. 12.

Light receiving element 20 in FIG. 20 was prepared by placing light receiving sections with a diameter of 3 μm in array, which could identify a place with an accuracy of about 1 μm by an intensity distribution of incident light.

In this example, an optically functional element was prepared using No. 22 thin film. Light such as sunlight and electric light was introduced as a light source. Length along optical axis direction was 20 mm. Results showed that an outgoing light moved on the light receiving section just as in example 2, making temperature measurement possible up to about 500° C. with an accuracy of 0.2° C. Longer length along optical axis enabled the measurement of refractive index with better accuracy in proportion to the length.

In this example, an array of light receiving elements was used for light receiving section, but temperature could be measured with similar accuracy, even by scanning a single light receiving device along a light transmission plane.

Example 4

Figure 21:
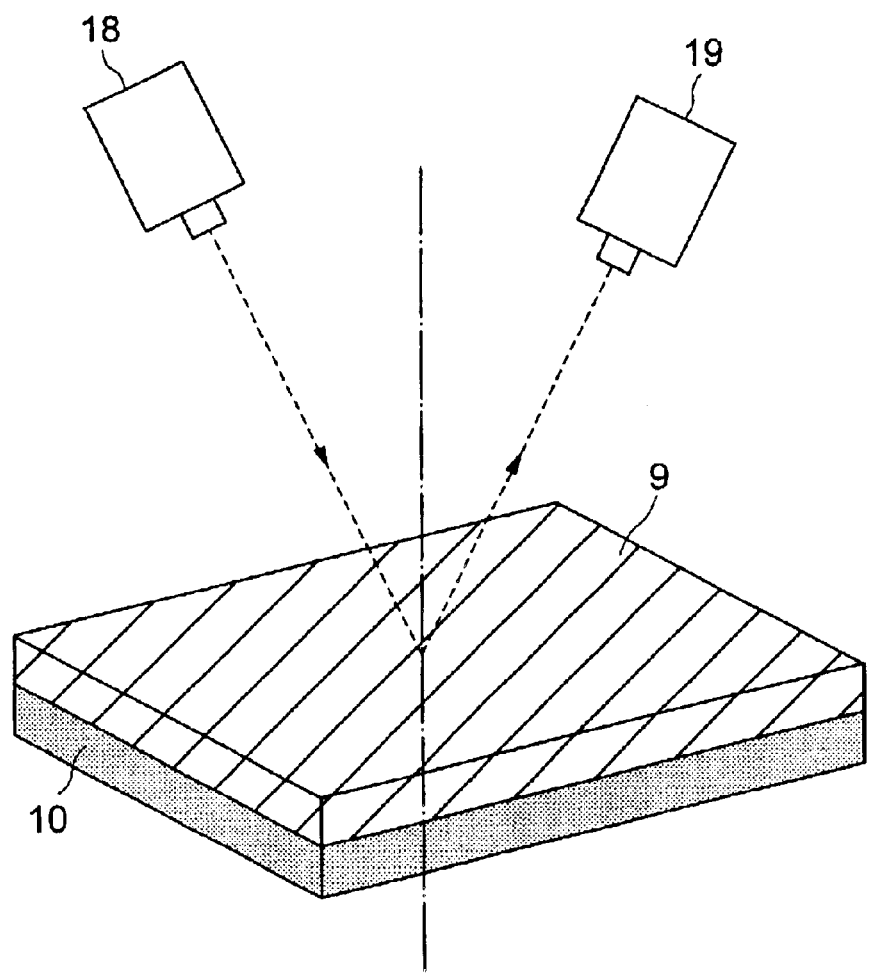

FIG. 21 shows an example of temperature sensor having another structure prepared in this example. In FIG. 21, 9 is a film with a changeable refractive index, 10 is a substrate, 18 is a light source and 19 is a light receiver to detect light intensity. Light reflectance changes with refractive index, and is expressed by the following formula:

$$R = \frac{(n-1)^2 + k^2}{(n+1)^2 + k^2}$$

wherein, R is reflectance, n is refractive index and k is extinction coefficient. Since R changes with a change in n, temperature can be detected by determining R.

Figure 22:
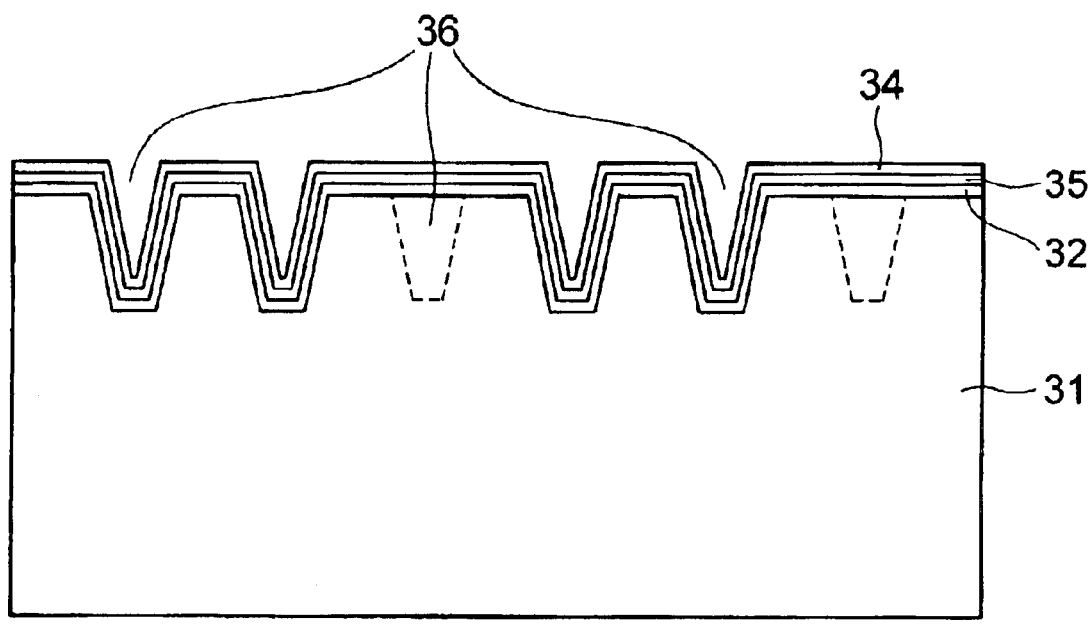
FIG. 22 shows partial cross-sectional view of recording medium of optical information in accordance with the present invention.
Figure 22:

FIG. 22 shows change in reflectance of No. 21 film when refractive index changes with temperature. Reflectance changed in the range of about 0.18–0.227 with temperature change in the range from room temperature to 325° C. Temperature was measured using this relation. As a result, it was found that temperature could be measured up to about 500° C. with an accuracy of 0.1° C.

Example 5

FIG. 22 is schematic drawing of partial cross-sectional view of ROM disk prepared in this example. In FIG. 22, 31 is a substrate, 32 is an optically functional thin film, 35 is $SiO_2$ protection film, 34 is a reflection film made of an Al—Ti based material and 36 is a pit with information written. As a substrate 31, polycarbonate, polyolefin or glass is used depending on specifications, and polycarbonate was selected in this example. Light for reading (such as laser light) is introduced from bottom side as shown by the arrow mark in FIG. 22.

In addition, ROM disk was prepared by the following process. Firstly, a pit pattern with information was formed on a photoresist by using laser. Then the pit pattern was copied to a Ni mold with which polycarbonate was molded by injection to form a substrate. An optically functional thin film 32 with a desired thickness was formed on this substrate by sputtering and $SiO_2$ protection film 5 was formed with a thickness of 140 nm. Then a reflection film 34 with a thickness of 100 nm was formed by sputtering from an Al—Ti based material. Thickness of the substrate 1 was 0.6 mm, and 1.2 mm thick ROM disk was obtained by pasting together two substrates (as shown in FIG. 22) thus formed in this example, with the reflection film 34 at the backside, using an UV-curable resin. Thickness of ultra high resolution film 32 was selected in the range not less than 100 nm and not higher than 300 nm.

In this example, ROM disks were prepared using the compositions shown in the above example 1 as the optically functional thin film 32, and ultra resolution characteristics of each disk were evaluated. For sputtering, a sputtering equipment which enabled simultaneous sputtering of two films was used. By changing powers for each sputtering independently, a composition was varied on a film.

Figure 23:
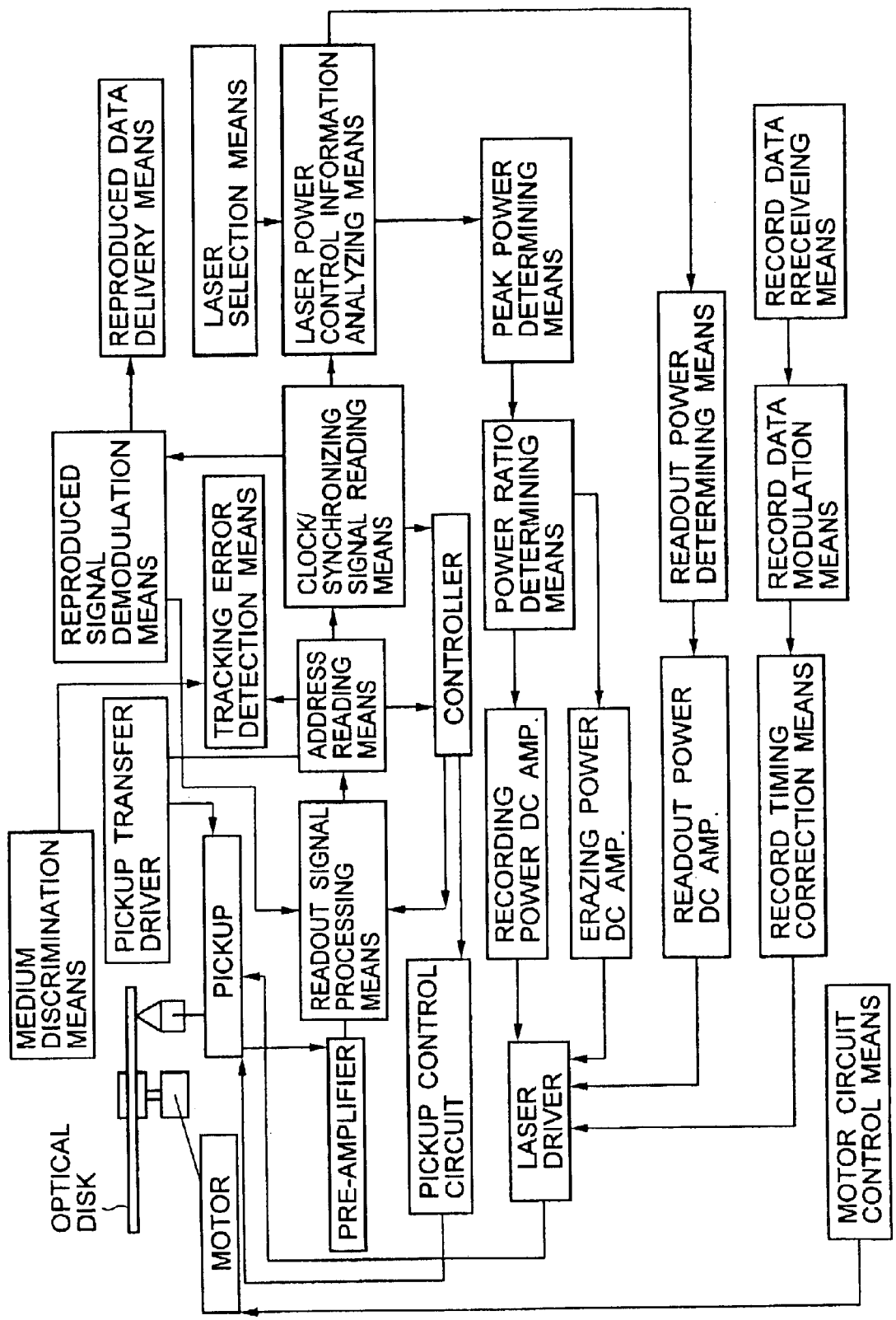
FIG. 23 shows a block diagram of reproduction equipment of optical information record in accordance with the present invention.

FIG. 23 is a block diagram of reproduction equipment for optical information record used in this example. The equipment has a medium discrimination means to determine type of optical disk as an optical memory medium. Optical disk is temporarily fixed in a rotation mechanism connected directly or indirectly to motor rotation axis, which is controlled by motor circuit control means. Information on an optical disk is read as an optical signal by laser which is a light source in pickup and a detector for reflected light. Information is stored in the optical disk by the light source in pickup. Optical signal goes out of equipment via pre-amplifier, readout signal processing means, address reading means, clock/synchronized signal reading means, reproduced signal demoduration means and reproduced data delivery means. Reproduced data are output by a designated output means such as display or speaker, or processed by an information processing device such as personal computer.

In this example, a laser selection means was mounted which can select an optional laser wavelength, in addition to a circuit system used in usual record reproduction. A peak power used is determined by peak power determining means based on output of the laser selection means and analysis of laser power control information analyzing means. Likewise, readout power is determined by readout power determining means. Output of peak power determining means is input into laser driver via power ratio determining means, recording power DC amplifier and erasing power DC amplifier, and controls light source in pickup. In addition, practically mounted lasers were 780 nm used for CD, 650 nm used for DVD and semiconductor lasers of 520 nm and 410 nm.

Since focal point and focal depth varies depending on wavelength, a structure enabling auto-focusing with laser selection was adopted. In addition, an ultra high resolution film having optical function was mounted to a disk, and a tracking error detection means for a high density recording was additionally mounted to correspond to a narrower tracking width, thus tracking corresponding to medium was made possible. Further, medium discrimination means using difference in reflectance among media was mounted, thus the equipment was designed so that tracking could be done automatically matching with various medium types. In data recording, recording data is input from recording data receiving means, modulated by recording data modulation means, input into laser driver via record timing correction means, and control light source in pickup.

By adopting the composition as shown in FIG. 23, it becomes possible not only to use conventional CD and DVD compatibly but also to use disks having different recording capacities due to enhancement of capacity on one equipment. The composition of optical information reproducing and recording equipment may be altered adequately depending on objectives and applications.

Reproduction output characteristics of optically functional thin films prepared was evaluated on a low frequency component (2 MHz) and a high frequency component (10 MHz) when readout power was varied as 1, 2, 3 and 4 mW for the compositions of the films described in Example 1.

The laser light used for readout was a semiconductor laser with a wavelength of 650 nm. Results showed that refractive index of an optically functional thin film in this example was changed by laser light irradiation, by which focus area of laser light became narrower and thus recording and reproduction in a higher density became possible. Change in refractive index occurs due to lens effect by an elevated temperature of thin film up to about 300° C. by laser light irradiation.

Example 6

Figure 24:
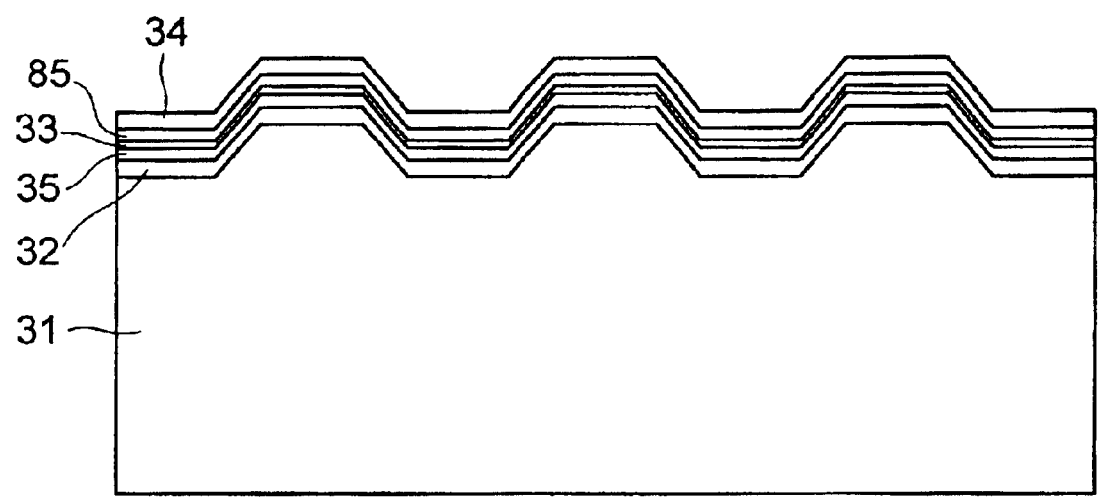
FIG. 24 shows partial cross-sectional view of RAM disk produced in an Example of the present invention.
Figure 24:

FIG. 24 is a schematic diagram of partial cross-sectional view of RAM disk prepared in this example. In FIG. 24, 31 is a substrate, 32 is an ultra high resolution film, 33 is a recording film, 34 is a reflection film and 35 and 85 are protection films. Arrow mark in this Fig. shows incident direction of light (such as laser light) for recording and reproduction. In this example, a disc shape of polycarbonate substrate with a thickness of 0.6 mm and a diameter of 120 mm was used as a substrate 31, on which a high resolution film 32 with a thickness of 300 nm was formed by sputtering method. Then protection film of ZnS—$SiO_2$ was overcoated to 80 nm thickness, followed by forming a phase change film as a recording film with a thickness of about 20 nm based on Ge—Sb—Te using the same sputtering method. After forming an about 90 nm thick protection film, an AlTi reflection film was formed up to about 200 nm. A desired RAM disk was obtained, similarly as in ROM disk, by pasting two substrates (as shown in FIG. 24) thus formed with its reflection film 34 at the backside using an UV-curable resin.

In this example, the thin film described in example 1 was used as an optically functional thin film. In addition, as a comparative example, RAM disk without forming an ultra high resolution film was also prepared.

Using RAM disk having recording mark of the same shape at equal spaces, a relation between length of the recording mark and output intensity in reproduction was studied. In the case of readout laser power of 2 mW, it was found that the case with forming an optically functional thin film showed a higher reproduction output for a short mark length than the comparative example without forming an optically functional thin film. Based on these facts, it could be said that formation of optically functional thin film enabled reproduction for shorter mark length. Thus, the ultra high resolution effect was confirmed also in RAM disk.

Then a special intensity distribution of reflected light was studied when the above ultra high resolution effect was obtained. That is, an intensity distribution of laser light in beam passing direction was compared for the case with ultra high resolution effect obtained and the case without forming ultra high resolution film. Intensity of incident light showed a Gaussian distribution. Special intensity distribution of reflected light also had nearly a Gaussian distribution when optically functional thin film was not formed, while the distribution was deflected toward a progressing direction when optically functional thin film was formed. It was also found that beam diameter required to readout was smaller than that required when optically functional thin film was not formed. Thus, an intensity of readout light or its distribution could be changed by forming such optically functional thin film as in this example.

Then, dependency of this ultra high resolution effect on wavelength was studied. The wavelength dependency was obtained by measuring output for mark length at each wavelength, and determining the minimum value (lm) of the mark length giving output of not less than 30 dB. Laser lights of 410 nm (blue), 520 nm (green) and 650 nm (red) were used. In every film, the minimum value (lm) of mark length, giving output of not less than 30 dB, was found to become smaller with shorter wavelength. This is because shorter wavelength provides a smaller diameter of converged spot, and enables to reproduce smaller mark when the same optical lens is used. Further, the minimum value, lm ($\mu$m), of mark length decreased in every wavelength. Based on these facts, by mounting an optically functional thin film, it was found that readable mark length could be reduced due to a synergetic effect of shortening of laser wavelength and resolution effect.

INDUSTRIAL APPLICABILITY

An optically functional element of the present invention is an assembly of nanometer size fine particles, and changes in its electronic state or band gap in a quantum manner with temperature, resulting in a large change in refractive index with temperature change and that said change occurs rapidly in nano-second level and in reversible way. Therefore, the element can be used for optical switch or temperature sensor with a high accuracy and a rapid response time.

The present invention also provides optical switch with a rapid response and a high resolution of outgoing light receiving section due to mounting the above optically functional thin film.

The present invention further provides temperature sensor with a high accuracy and a rapid response rate, since it enables measurement of a range from room temperature to around 500° C. with a resolution of 0.1° C. and has a good response to temperature.

Moreover, the present invention provides high density recording as an optical information recording medium.

What is claimed is:

1. A temperature sensor comprising a light receiver light introduced from a light source and an optically functional element comprising an optically functional thin film to alter an optical pass of said light, the optically functional thin film being formed on a substrate, characterized in that said optically functional thin film comprises oxides and is composed of columnar crystal having an average diameter of not larger than 13 nm.

2. A temperature sensor comprising a light receiver to receive light introduced from a light source and an optically functional element comprising an optically functional thin film to alter an optical pass of said light, the optically functional thin film being formed on a substrate, wherein said thin film mainly comprises oxide of one or more of Co and Fe having a spinel structure and is composed of columnar crystal.

3. A temperature sensor comprising a light receiver to receive light introduced from a light source and an optically functional element comprising an optically functional thin film to alter an optical pass of said light, the optically functional thin film being formed on a substrate, wherein said thin film comprises $M_3O_4$ oxides of at least one of Co and Fe containing oxide of one or more of Si, Ti, Al, Te, alkaline metals and alkaline earth metals and is composed of columnar crystal.

* * * * *